US010784120B2

(12) United States Patent
Inoue et al.

(10) Patent No.: US 10,784,120 B2
(45) Date of Patent: Sep. 22, 2020

(54) LAMINATE, ETCHING MASK, METHOD OF PRODUCING LAMINATE, METHOD OF PRODUCING ETCHING MASK, AND METHOD OF PRODUCING THIN FILM TRANSISTOR

(71) Applicants: Japan Advanced Institute of Science and Technology, Ishikawa (JP); Sumitomo Seika Chemicals Co., Ltd., Hyogo (JP)

(72) Inventors: Satoshi Inoue, Nagano (JP); Tatsuya Shimoda, Nagano (JP); Kazuhiro Fukada, Hiroshima (JP); Kiyoshi Nishioka, Hyogo (JP)

(73) Assignees: JAPAN ADVANCED INSTITUTE OF SCIENCE AND TECHNOLOGY, Ishikawa (JP); SUMITOMO SEIKA CHEMICALS CO., LTD., Hyogo (JP)

( * ) Notice: Subject to any disclaimer, the term of this patent is extended or adjusted under 35 U.S.C. 154(b) by 33 days.

(21) Appl. No.: 16/082,479

(22) PCT Filed: Nov. 21, 2016

(86) PCT No.: PCT/JP2016/084398
§ 371 (c)(1),
(2) Date: Sep. 5, 2018

(87) PCT Pub. No.: WO2017/158930
PCT Pub. Date: Sep. 21, 2017

(65) Prior Publication Data
US 2019/0088501 A1    Mar. 21, 2019

(30) Foreign Application Priority Data
Mar. 14, 2016    (JP) .................................. 2016-049685

(51) Int. Cl.
*B32B 3/00*    (2006.01)
*H01L 21/3213*    (2006.01)
(Continued)

(52) U.S. Cl.
CPC .... *H01L 21/32137* (2013.01); *H01L 21/0271* (2013.01); *H01L 21/02189* (2013.01);
(Continued)

(58) Field of Classification Search
CPC ............... H01L 21/467; H01L 21/0271; H01L 21/02323; H01L 21/02288;
(Continued)

(56) References Cited

U.S. PATENT DOCUMENTS 7,560,049 B2    7/2009    Newsome et al.
2005/0245087 A1    11/2005    Sasagawa et al.
(Continued)

FOREIGN PATENT DOCUMENTS

CN    101990554 A    3/2011
EP    3032576 A1    6/2016
(Continued)

OTHER PUBLICATIONS

Extended European Search Report for European Application No. 16894547.5 dated May 16, 2019, 7 pp.
(Continued)

*Primary Examiner* — Elizabeth E Mulvaney
(74) *Attorney, Agent, or Firm* — Buckley, Maschoff & Talwalkar LLC

(57) ABSTRACT

A laminate by using a paste or solution containing aliphatic polycarbonates having an etching mask function is provided. A method of producing a laminate of the present invention includes a pattern forming step of forming a pattern 80 of a first oxide precursor layer in which a compound of metal to be oxidized into a metal oxide is dispersed in a solution
(Continued)

containing a binder (possibly including inevitable impurities) made of aliphatic polycarbonates on an oxide layer 44 or on the second oxide precursor layer to be oxidized into the oxide layer 44; an etching step of, after the pattern forming step, etching the oxide layer 44 or the second oxide precursor layer that is not protected by the pattern 80; and a heating step of, after the etching step, heating the oxide layer 44 or the second oxide precursor layer, and the first oxide precursor layer to a temperature at which the binder is decomposed or higher.

13 Claims, 14 Drawing Sheets

(51) Int. Cl.
| | | |
|---|---|---|
| *H01L 29/786* | (2006.01) | |
| *H01L 21/02* | (2006.01) | |
| *H01L 21/467* | (2006.01) | |
| *H01L 29/66* | (2006.01) | |
| *H01L 21/027* | (2006.01) | |

(52) U.S. Cl.
CPC .. *H01L 21/02192* (2013.01); *H01L 21/02194* (2013.01); *H01L 21/02288* (2013.01); *H01L 21/02323* (2013.01); *H01L 21/02554* (2013.01); *H01L 21/02565* (2013.01); *H01L 21/02614* (2013.01); *H01L 21/467* (2013.01); *H01L 29/66969* (2013.01); *H01L 29/7869* (2013.01); *H01L 21/02628* (2013.01)

(58) Field of Classification Search
CPC ......... H01L 21/02565; H01L 21/02554; H01L 21/02614; H01L 21/02194; H01L 21/32137
See application file for complete search history.

(56) References Cited

U.S. PATENT DOCUMENTS

| | | |
|---|---|---|
| 2006/0208630 A1 | 9/2006 | Roman, Jr. et al. |
| 2013/0011630 A1 | 1/2013 | Sullivan et al. |
| 2013/0320339 A1 | 12/2013 | Kawashima et al. |
| 2016/0181098 A1 | 6/2016 | Inoue et al. |
| 2016/0315198 A1 | 10/2016 | Inoue et al. |

FOREIGN PATENT DOCUMENTS

| | | |
|---|---|---|
| JP | 2005340800 A | 12/2005 |
| JP | 2007134547 A | 5/2007 |
| JP | 2007165900 A | 6/2007 |
| JP | 2007201056 A | 8/2007 |
| JP | 2014432289 A | 12/2014 |
| JP | 2015093339 A | 5/2015 |
| TW | 201511291 A | 3/2015 |
| TW | 201529635 A | 8/2015 |
| WO | 2009/125288 A2 | 10/2009 |
| WO | 2015019771 A1 | 2/2015 |
| WO | 2015093455 A1 | 6/2015 |
| WO | 2015019771 A1 | 3/2017 |

OTHER PUBLICATIONS

"Taiwanese Office Action", dated Dec. 10, 2019, Taiwan Intellectual Property Office (TIPO) for Taiwanese Application No. 105138806, 17pages.

"English-languation Translation of Taiwanese Office Action", dated Dec. 10, 2019, Taiwan Intellectual Property Office (TIPO) for Taiwanese Application No. 105138806, 12pages.

"Japanese Office Action", Date of Drafting May 15, 2020, for Japanese Application No. 2018-505240, 5pages.

English-language Translation of Japanese Office Action, Date of Drafting May 15, 2020, for Japanese Application No. 2018-505240, 5pages.

[Fig. 1A]
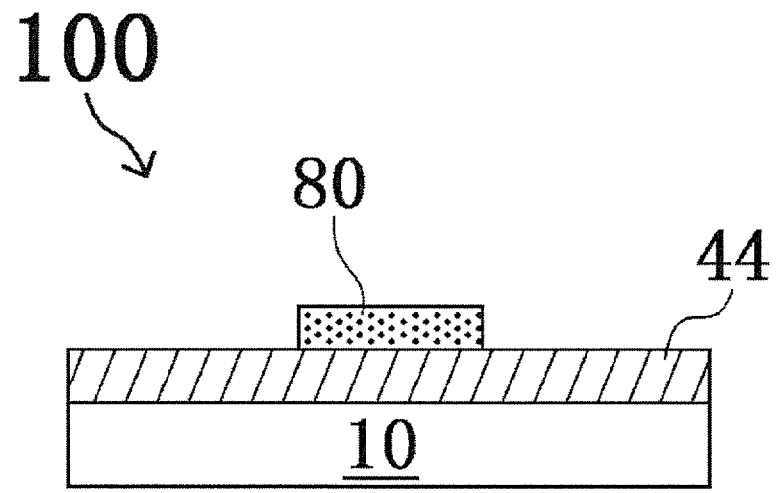
[Fig. 1B]
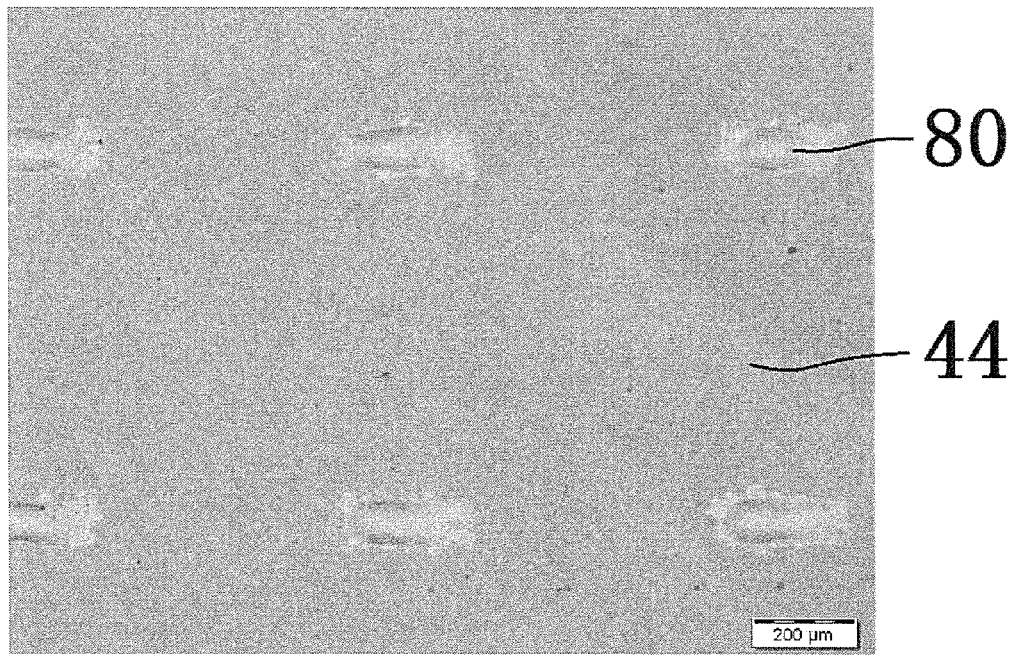

[Fig. 2A]
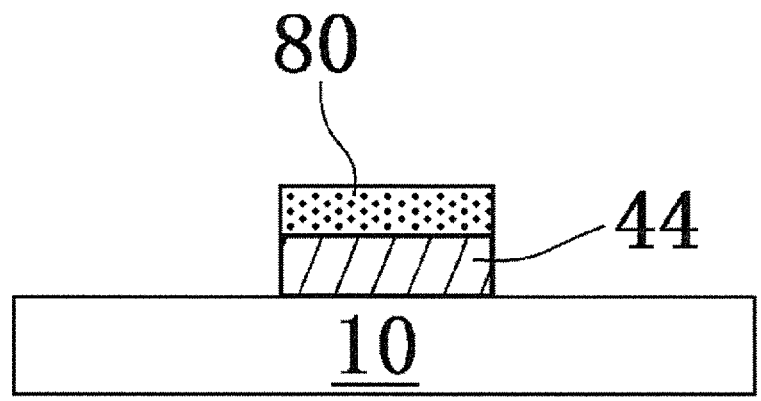
[Fig. 2B]
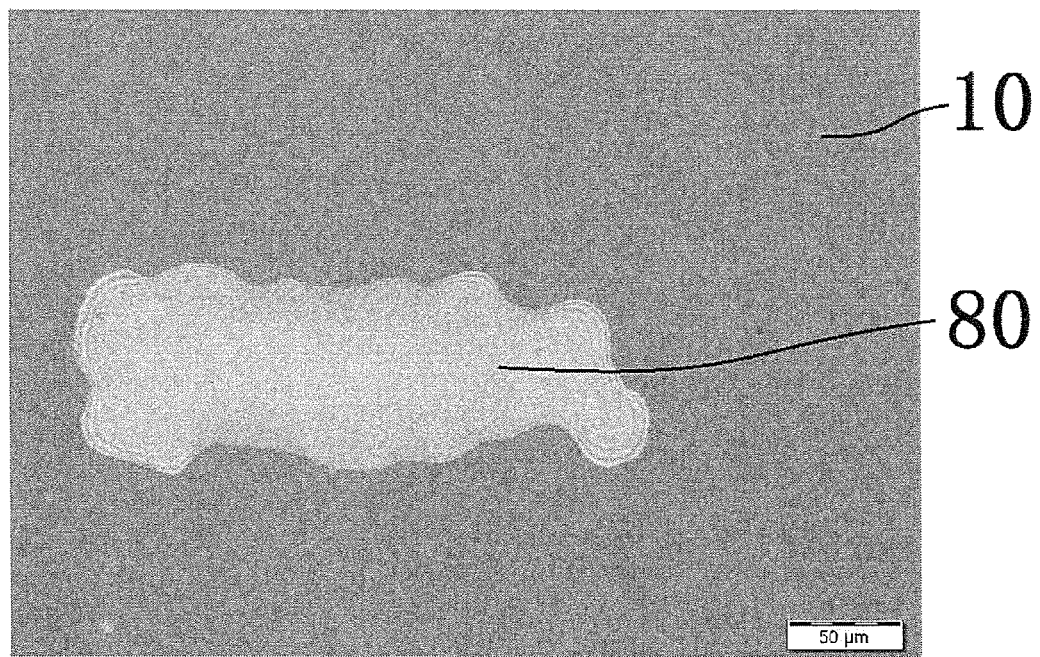

[Fig. 3A]
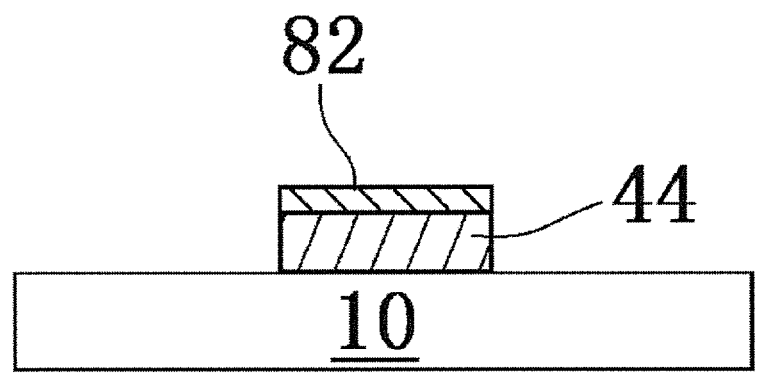
[Fig. 3B]
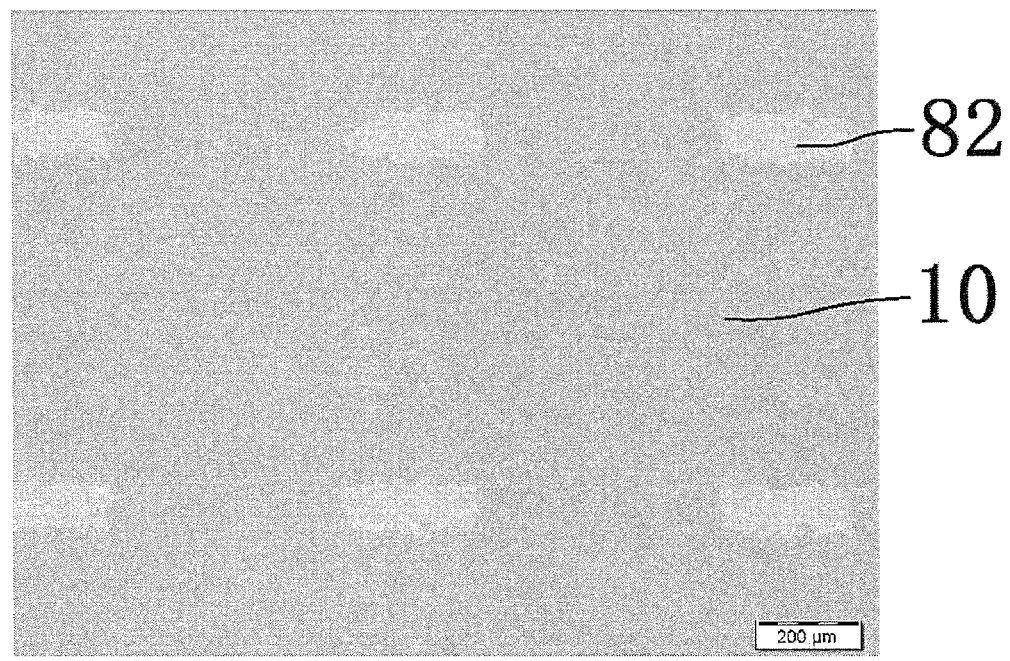

[Fig. 4A]
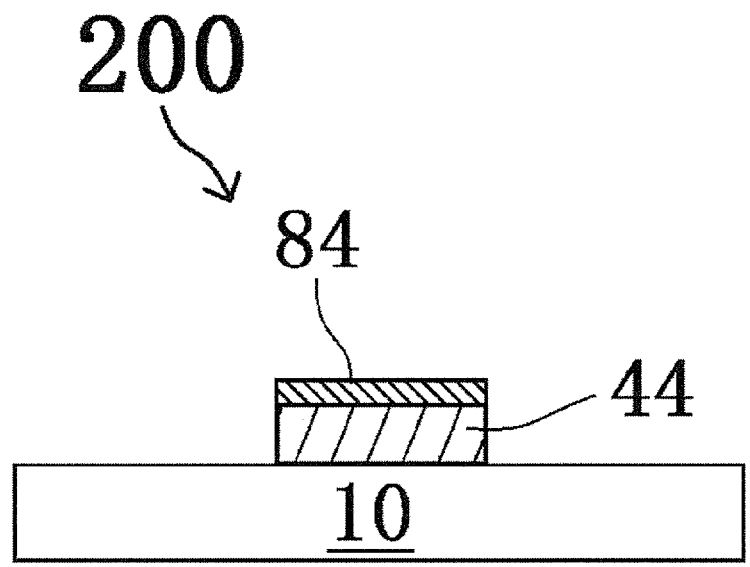
[Fig. 4B]
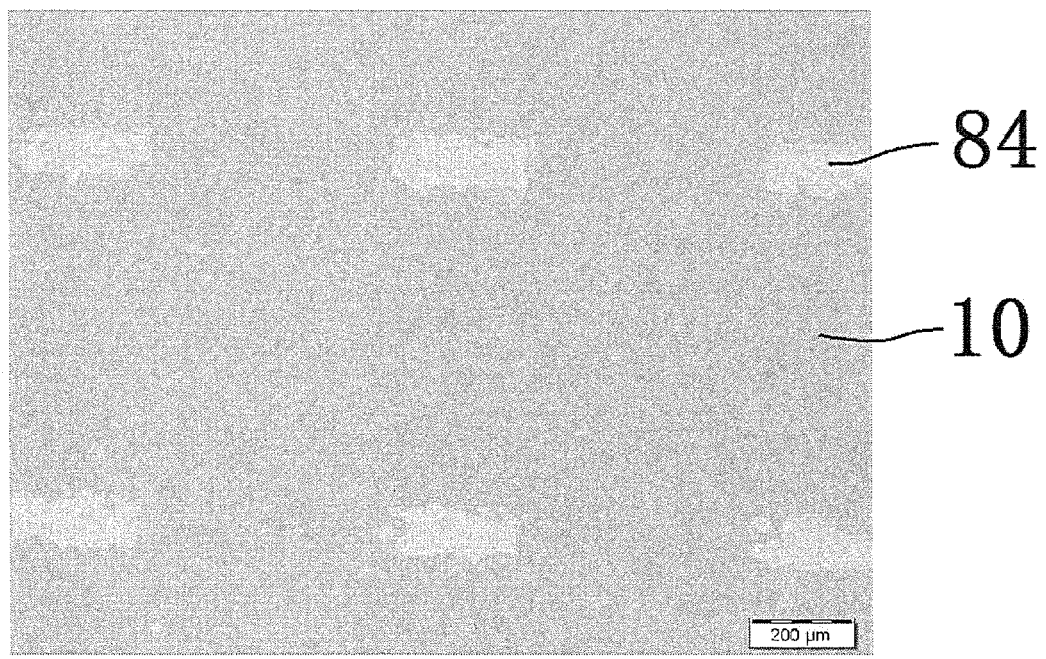

[Fig. 5]
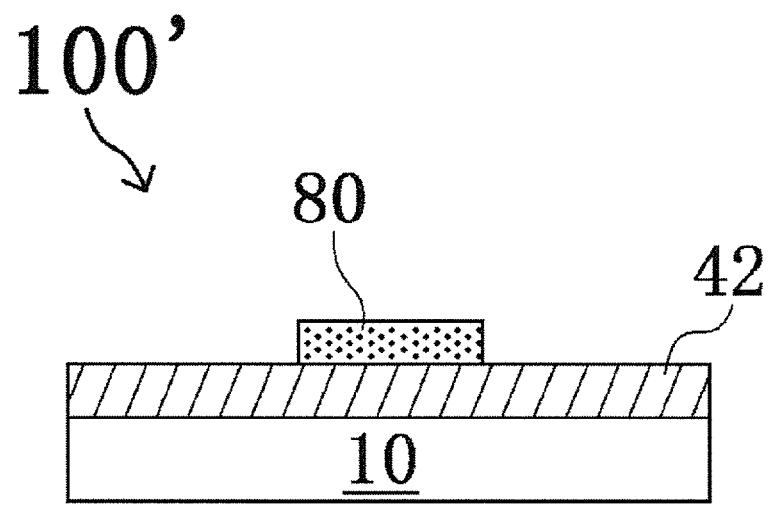
[Fig. 6]
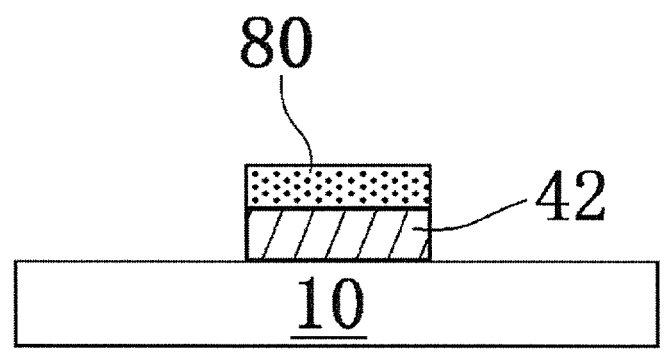

[Fig. 7]
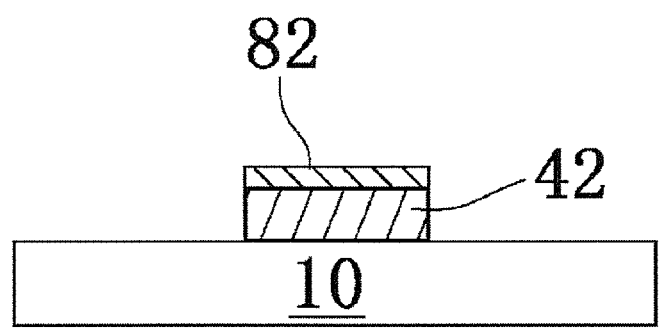
[Fig. 8]
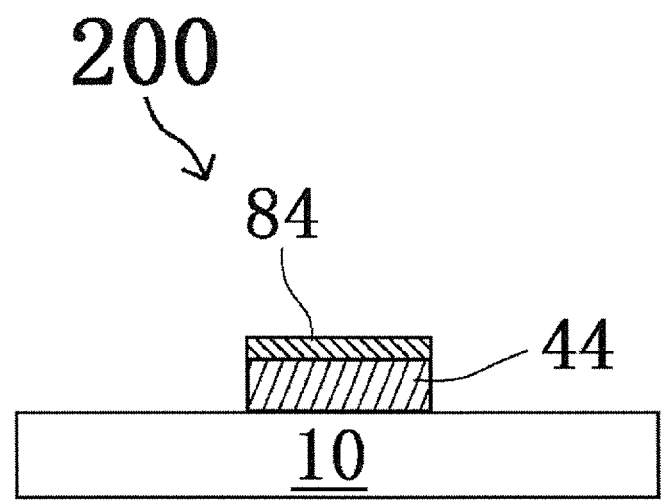

[Fig. 9]
(1) 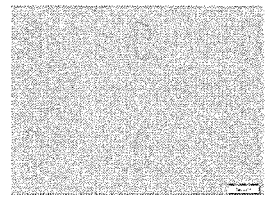  (7) 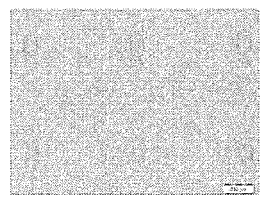  (8) 
[Fig. 10A]
(5) 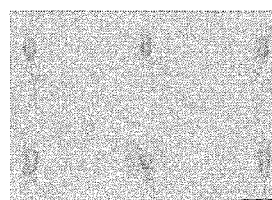  (9) 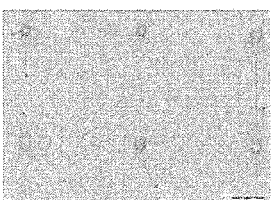  Strand (10) 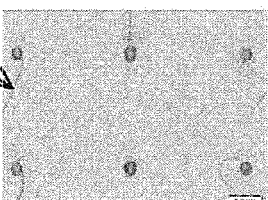
[Fig. 10B]
(9)   (10) 

[Fig. 11]
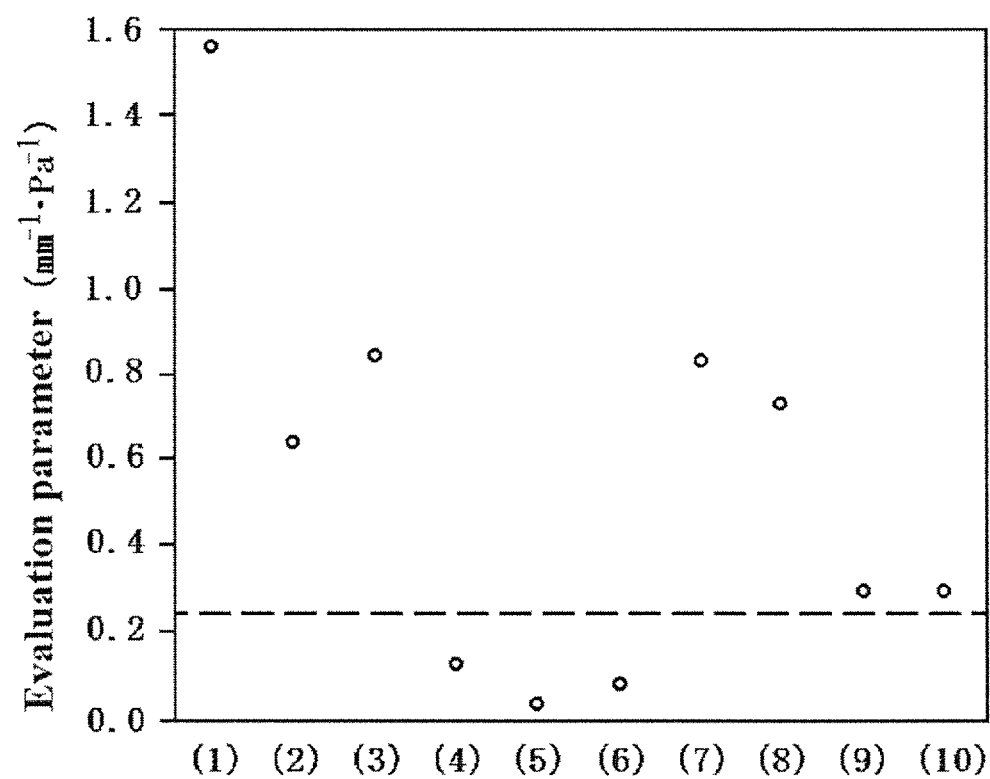

[Fig. 12A]
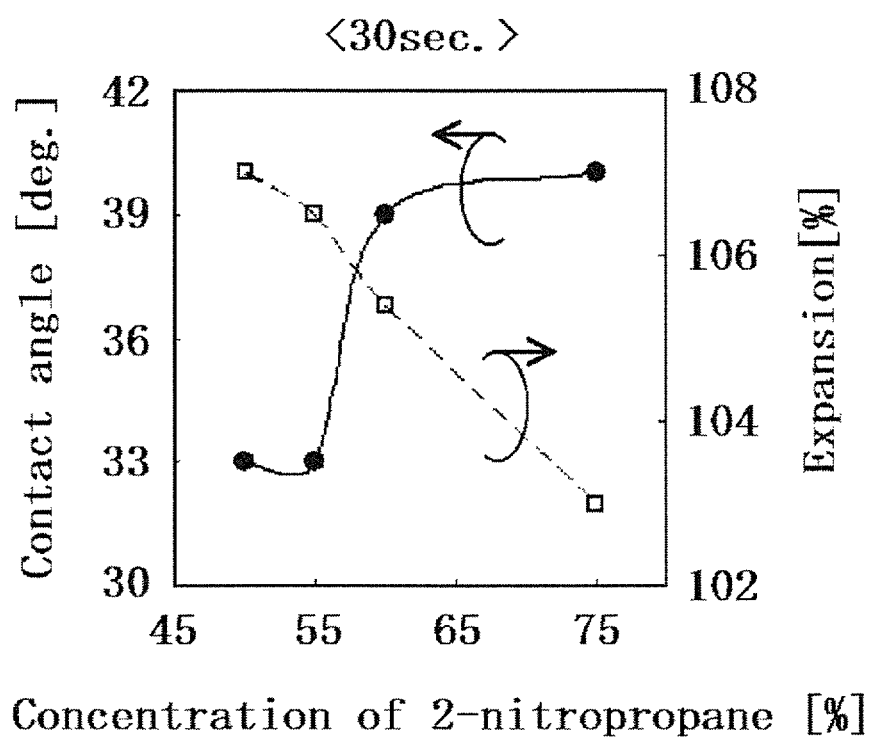

[Fig. 12B]
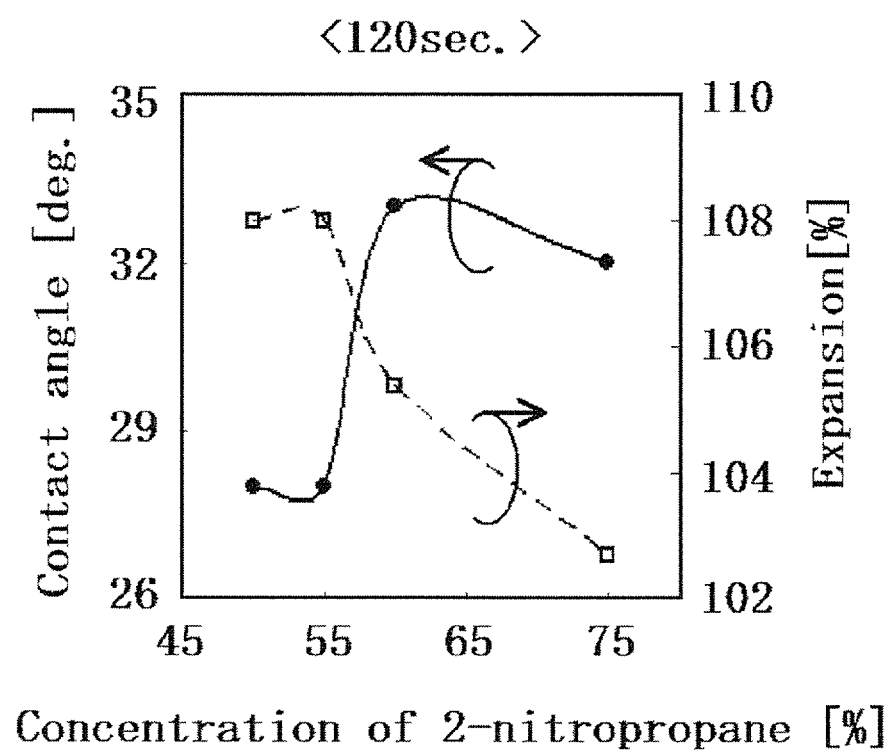

[Fig. 13]
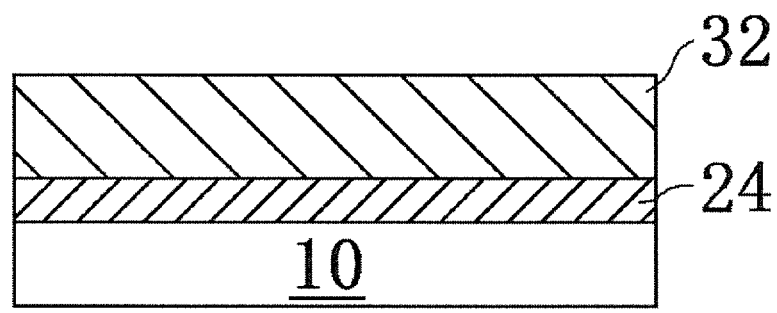
[Fig. 14]
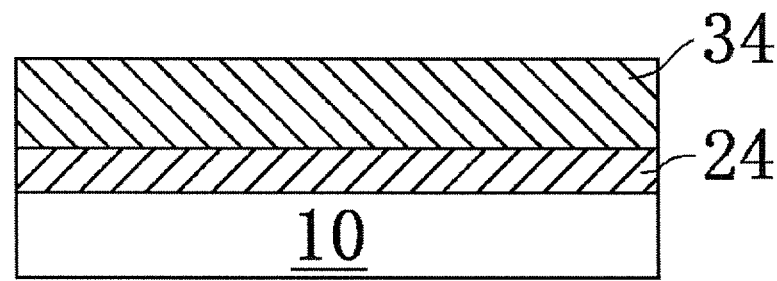

[Fig 15]
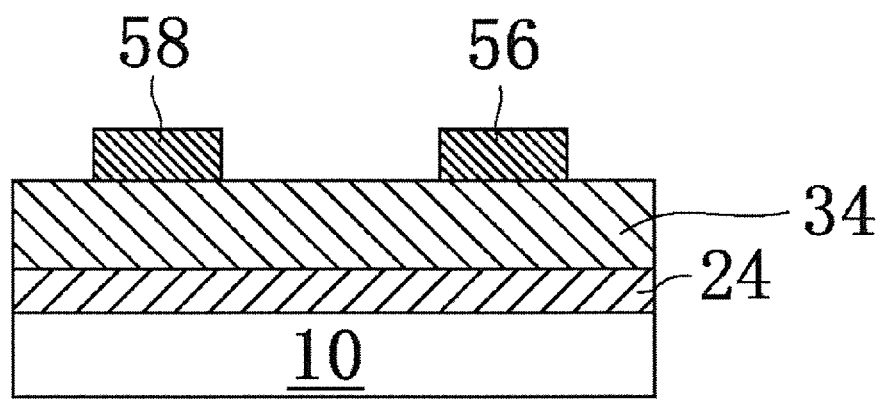
[Fig. 16]
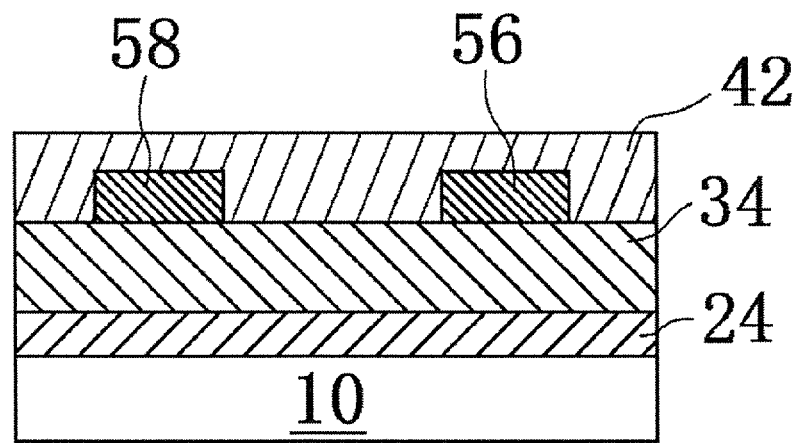

[Fig. 17]
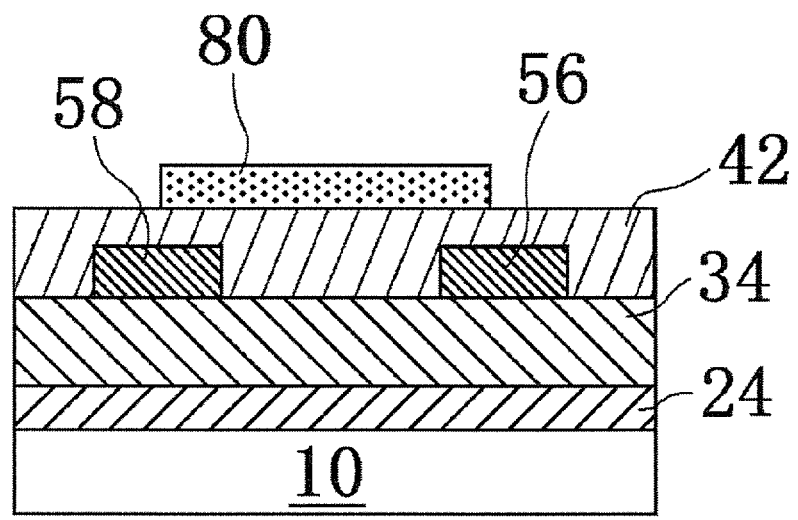
[Fig. 18]
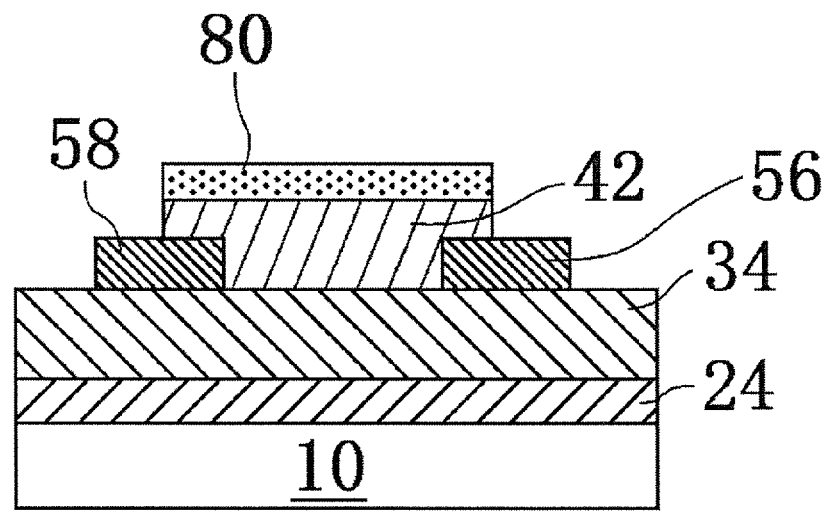

[Fig. 19]
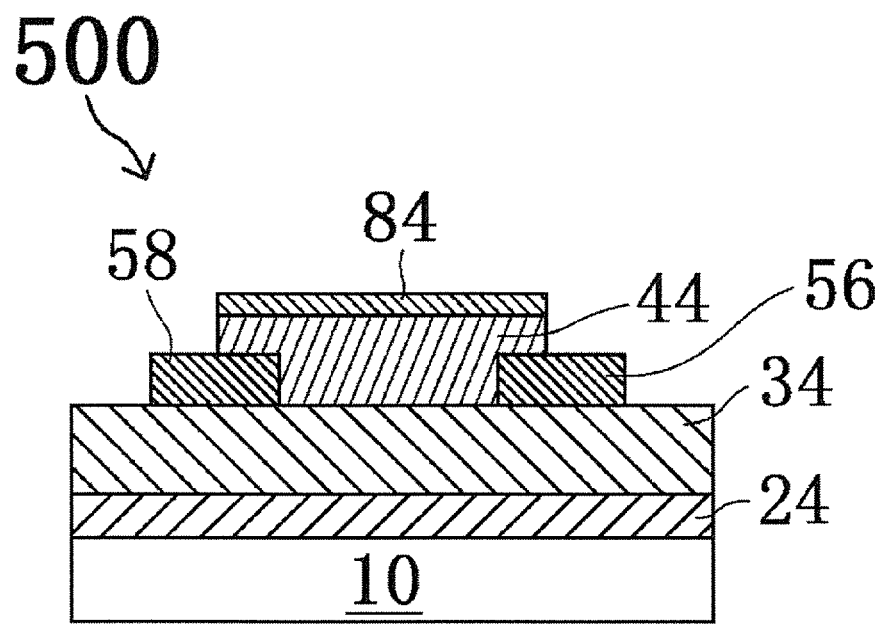

LAMINATE, ETCHING MASK, METHOD OF PRODUCING LAMINATE, METHOD OF PRODUCING ETCHING MASK, AND METHOD OF PRODUCING THIN FILM TRANSISTOR

This application is a U.S. national Stage filing under 35 U.S.C. § 371 and 35 U.S.C. § 119, based on and claiming priority to PCT/JP2016/084398, filed Nov. 21, 2016 and JP Patent Application No. 2016-049685, filed Mar. 14, 2016.

TECHNICAL FIELD

The present invention relates to a laminate, an etching mask, a method of producing a laminate, a method of producing an etching mask, and a method of producing a thin film transistor.

BACKGROUND ART

Conventionally, a polycrystalline silicon film or an amorphous silicon film has been mainly used as a channel layer of a thin film transistor, which is an example of an electronic device. However, in the case of the polycrystalline silicon film, electron mobility is limited by scattering of electrons occurring at the polycrystalline particle interface, resulting in variations in transistor characteristics. Also, in the case of the amorphous silicon film, there is a problem that electron mobility is extremely low, element deterioration occurs with time, and reliability of the element is extremely lowered. Therefore, attention is focused on oxide semiconductors whose electron mobility is higher than that of the amorphous silicon film and variation in transistor characteristic is smaller than that of the polycrystalline silicon film. In addition, not only an oxide semiconductor but also an oxide conductive material or oxide insulator made of an oxide are, for example, an essential technical element for realizing an electronic device using only an oxide, thus, interests in them are very high in industry.

Recently, attempts have been actively made to prepare electronic devices on a flexible resin substrate by a low-energy production process such as a printing method. By using a printing method or the like, the semiconductor layer can be directly patterned on the substrate, so that there is an advantage that an etching treatment step for patterning can be omitted.

For example, as disclosed in Patent Documents 1 to 3, attempts have been made to prepare coated flexible electronic devices using conductive polymers and organic semiconductors. In addition, the present applicants have disclosed a technique to solve a part of the above-described problems (Patent Documents 4 and 5).

PRIOR ART DOCUMENTS

Patent Documents

Patent Document 1: Japanese Patent Laid-open Publication No. 2007-134547
Patent Document 2: Japanese Patent Laid-open Publication No. 2007-165900
Patent Document 3: Japanese Patent Laid-open Publication No. 2007-201056
Patent Document 4: International Publication No. WO 2015/019771
Patent Document 5: International Publication No. WO 2015/093455

SUMMARY OF THE INVENTION

Problems to be Solved by the Invention

While various types of information terminals and information appliances are requested by industries and consumers, semiconductors need to operate at a higher speed, be stable for a long period, and have a low environmental burden. However, in the prior art, it is common to adopt a process requiring a comparatively long time and/or an expensive facility such as a vacuum process or a process using a photolithography method, so that use efficiencies of raw materials and production energy become very poor. This is not preferable from the viewpoint of industrial or mass productivity. On the other hand, at present, it is extremely difficult to form a layer by a printing method such as gravure printing, screen printing, offset printing or inkjet printing, on a silicon semiconductor or another semiconductor that has been mainly used so far. In addition, even when the conductive polymers and organic semiconductors described in Patent Documents 1 to 3 are adopted, their electrical properties and stability are still insufficient.

Solutions to the Problems

In addition to the research and development of various metal oxides formed from liquid materials, the inventors of this application have intensively studied and analyzed to more reliably realize formation of a pattern of such metal oxide, and also to realize an etching mask capable of protecting the metal oxide without impairing the function of the metal oxide as much as possible. More specifically, the inventors of this application intensively studied and analyzed to more reliably maintain or improve the function of various layers, or realize elemental technologies that can realize reduction of production step of the layers and various devices using the elemental technologies, not only by having a function as an etching mask capable of forming a pattern, but also by using the etching mask.

In the studies and analysis made by the inventors of this application so far, a process of pattern formation of a gelatinous layer (hereinafter also referred to as "gel layer") obtained from the paste or solution has been investigated. As a result, several interesting findings have been obtained before decomposition of aliphatic polycarbonates constituting the gel layer, i.e., at the stage prior to heating at the temperature at which the aliphatic polycarbonates decompose.

Specifically, the inventors of this application have acquired knowledge that a paste or solution containing aliphatic polycarbonates can have a function as an etching mask and it can remain as a functional film or layer after finishing its role as an etching mask. In addition, the term "layer(s)" in this application conceptually includes not only a layer but also a film. Similarly, the term "film" in this application conceptually includes not only a film but also a layer.

As a result of further research based on the findings, the inventors of this application have succeeded in more reliably removing an unnecessary component after an etching mask formed on an etching target layer finishes a role as a mask and then allowing the etching mask to remain on the etching target layer as a functional layer. As a result, the inventors of this application have found that formation of a laminate by so-called self-alignment can be realized, by using a paste or solution containing aliphatic polycarbonates having a function as an etching mask.

Since the result can be realized even when a low-energy production process (for example, printing method) is supposed to be used, the technical significance of the contents disclosed in this application is very large. Also, from a different point of view, even when a compound of metal to be oxidized into a metal oxide that is hardly etched (i.e., a pattern is hardly formed) is supposed to be adopted, the finally formed layer of the metal oxide can serve as one layer of the patterned laminate when the compound of metal is dispersed in a solution containing a binder made of aliphatic polycarbonates. The present invention has been devised in accordance with each of the points.

The "process from a liquid state to a gel state" in this application is typically exemplified by a state where a solvent is removed to some extent (typically at a mass ratio of 80% or more with respect to the entire solvent) by heat treatment but the aliphatic polycarbonate is substantially not decomposed.

In a laminate of the present invention, a pattern of a first oxide precursor layer in which a compound of metal to be oxidized into a metal oxide is dispersed in a solution containing a binder (possibly including inevitable impurities) made of aliphatic polycarbonates is placed on an oxide layer or on the second oxide precursor layer to be oxidized into the oxide layer.

In this laminate, the pattern of the first oxide precursor layer is placed on the oxide layer or the second oxide precursor layer. The pattern can serve as an etching mask to etch the oxide layer or the second oxide precursor layer. In addition, the binder made of aliphatic polycarbonates constituting a part of the pattern is decomposed by heating, whereby the metal oxide can be formed as a layer on the etched oxide layer, without requiring so-called alignment. Therefore, by using this laminate, it is possible to realize reduction of step for forming a final oxide laminate or laminated structure. Also, from a different point of view, even when a compound of metal to be oxidized into a metal oxide that is hardly etched (i.e., a pattern is hardly formed) is supposed to be adopted, the finally formed layer of the metal oxide can serve as one layer of the patterned laminate when the compound of metal is dispersed in a solution containing a binder made of aliphatic polycarbonates.

Also, an etching mask of the present invention is for an oxide layer or a second oxide precursor layer to be oxidized into the oxide layer. In addition, this etching mask includes a pattern of a first oxide precursor layer in which a compound of metal to be oxidized into a metal oxide is dispersed in a solution containing a binder (possibly including inevitable impurities) made of aliphatic polycarbonates.

This etching mask is a mask for etching an oxide layer or a second oxide precursor layer to be oxidized into the oxide layer. Further, the pattern of the first oxide precursor layer that is this etching mask is placed on the oxide layer to be etched or the second oxide precursor layer to be etched. In addition, the binder made of aliphatic polycarbonates constituting a part of the pattern is decomposed by heating, whereby the metal oxide can be formed as a layer on the etched oxide layer, without requiring so-called alignment. Therefore, by using this etching mask, it is possible to realize reduction of step for forming a final oxide laminate or laminated structure. Also, from a different point of view, according to this etching mask, even when a compound of metal to be oxidized into a metal oxide that is hardly etched (i.e., a pattern is hardly formed) is supposed to be adopted, the finally formed layer of the metal oxide can serve as one layer of the patterned laminate when the compound of metal is dispersed in a solution containing a binder made of aliphatic polycarbonates.

In addition, a method of producing a laminate of the present invention includes a pattern forming step of forming a pattern of a first oxide precursor layer in which a compound of metal to be oxidized into a metal oxide is dispersed in a solution containing a binder (possibly including inevitable impurities) made of aliphatic polycarbonates on an oxide layer or on the second oxide precursor layer to be oxidized into the oxide layer; an etching step of, after the pattern forming step, etching the oxide layer or the second oxide precursor layer that is not protected by the pattern; and a heating step of, after the etching step, heating the oxide layer or the second oxide precursor layer, and the first oxide precursor layer to a temperature at which the binder is decomposed or higher.

According to this method of producing a laminate, the pattern of the first oxide precursor layer is formed on the oxide layer or the second oxide precursor layer by the pattern forming step. The pattern can serve as an etching mask to etch the oxide layer or the second oxide precursor layer in the etching step. Therefore, in the heating step, the binder constituting a part of the pattern is decomposed by heating at the decomposition temperature of the aliphatic polycarbonate or higher, whereby the metal oxide can be formed as a layer on the etched oxide layer, without requiring so-called alignment. Therefore, by using this method of producing a laminate, it is possible to realize reduction of step for forming a final oxide laminate or laminated structure. Also, from a different point of view, even when a compound of metal to be oxidized into a metal oxide that is hardly etched (i.e., a pattern is hardly formed) is supposed to be adopted, the finally formed layer of the metal oxide can serve as one layer of the patterned laminate when the compound of metal is dispersed in a solution containing a binder made of aliphatic polycarbonates.

Further, a method of producing a thin film transistor of the present invention, for example, includes a channel layer forming step of placing the oxide layer, as a channel layer, among the laminate formed by the heating step of the method of producing a laminate, so as to be in contact with a source electrode and a drain electrode.

According to this method of producing a thin film transistor, a metal oxide layer formed by heating a pattern of a first oxide precursor layer can be formed on the channel layer that is the oxide layer by so-called self-alignment. This metal oxide layer can function as a gate insulator or a channel stopper layer by the structure adopted by the thin film transistor, so that a great reduction of the production step can be realized.

Moreover, a method of producing an etching mask of the present invention is a method of producing an etching mask for an oxide layer or a second oxide precursor layer to be oxidized into the oxide layer. In addition, this method of producing an etching mask includes a pattern forming step of forming a pattern of a first oxide precursor layer in which a compound of metal to be oxidized into a metal oxide is dispersed in a solution containing a binder (possibly including inevitable impurities) made of aliphatic polycarbonates.

This method of producing an etching mask is a method of producing a mask for etching an oxide layer or a second oxide precursor layer to be oxidized into the oxide layer. Further, according to this method of producing an etching mask, a pattern forming step of forming the pattern of the first oxide precursor layer that is this etching mask on the oxide layer to be etched or the second oxide precursor layer to be etched is performed. As a result, the binder made of aliphatic polycarbonates constituting a part of the pattern is decomposed by heating, whereby the metal oxide can be formed as a layer on the etched oxide layer, without requiring so-called alignment. Therefore, by using this method of producing an etching mask, it is possible to realize reduction of step for forming a final oxide laminate or laminated structure. Also, from a different point of view, according to this method of producing an etching mask, even when a compound of metal to be oxidized into a metal oxide that is hardly etched (i.e., a pattern is hardly formed) is supposed to be adopted, the finally formed layer of the metal oxide can serve as one layer of the patterned laminate when the compound of metal is dispersed in a solution containing a binder made of aliphatic polycarbonates.

In any of the inventions, it should also be noted to have an advantage that, when the oxide layer in a region to be etched is etched using a pattern of a first oxide precursor layer that serves as an etching mask, removal of the binder made of aliphatic polycarbonates after finally forming a laminate pattern can be realized by heat treatment that is a relatively easy treatment.

Incidentally, the "metal oxide" in this application is a concept including an oxide semiconductor, an oxide conductive material, or an oxide insulator. In addition, each of an oxide semiconductor, an oxide conductive material, and an oxide insulator is a relative concept from the viewpoint of electroconductivity, and thus no strict distinction is required. Even when metal oxides are supposed to be of the same type, they are recognized by a person skilled in the art as oxide semiconductors in some cases, or can be recognized as oxide conductive materials or oxide insulators, depending on requirements of various devices. Also, the "substrate" in this application is not limited to a base in a plate shape but includes a base and a parent material in different modes. Furthermore, the "application" in each of the embodiments to be described later in this application refers to forming a layer on a substrate in accordance with a low-energy production process, typically a printing method. In addition, the "metal" in this application includes not only typical element metals but also transition metals.

Effects of the Invention

Adoption of a laminate of the present invention can contribute to reduction of step for forming a final oxide laminate or laminated structure. Also, from a different point of view, even when a compound of metal to be oxidized into a metal oxide that is hardly etched (i.e., a pattern is hardly formed) is supposed to be adopted, the finally formed layer of the metal oxide can serve as one layer of the patterned laminate.

By adopting an etching mask of the present invention, it is possible to realize reduction of step for forming a final oxide laminate or laminated structure. Also, from a different point of view, even when a compound of metal to be oxidized into a metal oxide that is hardly etched (i.e., a pattern is hardly formed) is supposed to be adopted, the finally formed layer of the metal oxide can serve as one layer of the patterned laminate.

According to a method of producing a laminate of the present invention, it is possible to realize reduction of step for forming a final oxide laminate or laminated structure. Also, from a different point of view, even when a compound of metal to be oxidized into a metal oxide that is hardly etched (i.e., a pattern is hardly formed) is supposed to be adopted, the finally formed layer of the metal oxide can serve as one layer of the patterned laminate when the compound of metal is dispersed in a solution containing a binder made of aliphatic polycarbonates.

According to a method of producing a thin film transistor of the present invention, a metal oxide layer formed by heating a pattern of a first oxide precursor layer can be formed on a channel layer that is an oxide layer by so-called self-alignment. This metal oxide layer can function as a gate insulator or a channel stopper layer by the structure adopted by the thin film transistor, so that a great reduction of the production step can be realized.

According to a method of producing an etching mask of the present invention, it is possible to realize reduction of step for forming a final oxide laminate or laminated structure. Also, from a different point of view, according to this method of producing an etching mask, even when a compound of metal to be oxidized into a metal oxide that is hardly etched (i.e., a pattern is hardly formed) is supposed to be adopted, the finally formed layer of the metal oxide can serve as one layer of the patterned laminate.

BRIEF DESCRIPTION OF THE DRAWINGS

FIG. 1A is a schematic sectional view showing a process in a method of producing a laminate according to a first embodiment.

FIG. 1B is an optical photograph by an optical microscope in a plan view, showing the process in the method of producing a laminate according to the first embodiment.

FIG. 2A is a schematic sectional view showing a process in a method of producing a laminate according to the first embodiment.

FIG. 2B is an optical photograph by an optical microscope in a plan view, showing the process in the method of producing a laminate according to the first embodiment.

FIG. 3A is a schematic sectional view showing a process in a method of producing a laminate according to the first embodiment.

FIG. 3B is an optical photograph by an optical microscope in a plan view, showing the process in the method of producing a laminate according to the first embodiment.

FIG. 4A is a schematic sectional view showing a process in a method of producing a laminate according to the first embodiment.

FIG. 4B is an optical photograph by an optical microscope in a plan view, showing the process in the method of producing a laminate according to the first embodiment.

FIG. 5 is a schematic sectional view showing a process in a method of producing a laminate of a modification example according to the first embodiment.

FIG. 6 is a schematic sectional view showing a process in a method of producing a laminate of a modification example according to the first embodiment.

FIG. 7 is a schematic sectional view showing a process in a method of producing a laminate of a modification example according to the first embodiment.

FIG. 8 is a schematic sectional view showing a process in a method of producing a laminate of a modification example according to the first embodiment.

FIG. 9 shows typical examples of optical photomicrographs of good patterns realized in a modification example according to the first embodiment.

FIG. 10A shows typical examples of optical photomicrographs of unfavorable patterns formed in a modification example according to the first embodiment.

FIG. 10B shows typical examples of optical photomicrographs of good patterns realized in a modification example according to the first embodiment.

FIG. 11 is a graph showing the relationship between each sample and evaluation parameters indicating stringiness in a modification example according to the first embodiment.

FIG. 12A is a graph showing the contact angle between a base material and a solution and the expansion ratio of the solution on the base material with respect to changes in the concentration of 2-nitropropane at 30 seconds after placement of the solution containing aliphatic polycarbonates on the base material, in a modification example according to the first embodiment.

FIG. 12B is a graph showing the contact angle between a base material and a solution and the expansion ratio of the solution on the base material with respect to changes in the concentration of 2-nitropropane at 120 seconds after placement of the solution containing aliphatic polycarbonates on the base material, in a modification example according to the first embodiment.

FIG. 13 is a schematic sectional view showing a process in a method of producing a thin film transistor according to a second embodiment.

FIG. 14 is a schematic sectional view showing a process in a method of producing a thin film transistor according to the second embodiment.

FIG. 15 is a schematic sectional view showing a process in a method of producing a thin film transistor according to the second embodiment.

FIG. 16 is a schematic sectional view showing a process in a method of producing a thin film transistor according to the second embodiment.

FIG. 17 is a schematic sectional view showing a process in a method of producing a thin film transistor according to the second embodiment.

FIG. 18 is a schematic sectional view showing a process in a method of producing a thin film transistor according to the second embodiment.

FIG. 19 is a schematic sectional view showing a process in a method of producing a thin film transistor according to the second embodiment.

DESCRIPTION OF REFERENCE SIGNS

10: Substrate
24: Gate electrode
32: Gate insulator precursor layer
34: Gate insulator
42: Second oxide precursor layer, Channel precursor layer
44: Oxide layer, Channel
56: Drain electrode
58: Source electrode
80: Pattern of first oxide precursor layer
82: First oxide precursor layer before main annealing
84: First oxide layer, Channel stopper layer
100, 100', 200, 200': Laminate
500: Thin film transistor

EMBODIMENTS OF THE INVENTION

A laminate, an etching mask, a thin film transistor, as well as production methods therefor according to the embodiments of the present invention will now be described in detail with reference to the accompanying drawings. In this disclosure, common parts are denoted by common reference signs in all the drawings unless otherwise specified. Furthermore, components according to these embodiments are not necessarily illustrated in accordance with relative scaling in the drawings. Moreover, some of the reference signs may not be indicated for the purpose of easier recognition of the respective drawings.

<First Embodiment>

1. Laminate, Etching Mask, and Production Methods Therefor

In this embodiment, a state in which a compound of metal to be oxidized into a metal oxide is dispersed in a solution obtained by dissolving aliphatic polycarbonates (possibly including inevitable impurities. The same applies to the followings) in a certain solvent (typically, an organic solvent) is a "first oxide precursor". This "first oxide precursor" is also an "etching mask precursor".

In addition, the "first oxide precursor layer" of this embodiment represents a layered precursor from which the solvent has been removed to some extent (typically, "gel state" layer) by heating the "first oxide precursor" (etching mask precursor). This "pattern of a first oxide precursor layer" is also an "etching mask". Further, this gel state is, for example, a state in which it can be applied by a printing method.

In this embodiment, as will be described in detail later, the pattern of the first oxide precursor layer (etching mask) is used for etching an oxide layer or a second oxide precursor layer to be oxidized into the oxide layer. Therefore, in this embodiment, the first oxide precursor layer is temporarily placed on the oxide layer or on the second oxide precursor layer, as an etching mask for the oxide layer or the second oxide precursor layer.

The first oxide precursor (hereinafter also referred to as "etching mask precursor") or the pattern of the first oxide precursor layer (hereinafter also referred to as "etching mask") mainly contains aliphatic polycarbonate, but may contain compounds, compositions, or materials other than aliphatic polycarbonates. The lower limit value of the aliphatic polycarbonate content in the etching mask precursor or the etching mask is not particularly limited, but typically the mass ratio of the aliphatic polycarbonate to the total amount of the solute is 80% or more. Also, the upper limit value of the aliphatic polycarbonate content in the etching mask precursor or the etching mask is not particularly limited, but typically the mass ratio of the aliphatic polycarbonate to the total amount of the solute is 100% or less.

In addition, an etching target is subjected to an etching treatment using a pattern formed by, for example, a printing method (typically, a screen printing method), and thereafter, the aliphatic polycarbonates are subjected to decomposition and/or removal mainly by a heating step.

Also, with respect to the etching mask precursor and the etching mask of this embodiment, it can be said that the ability itself of the material of an aliphatic polycarbonate to exhibit its function as an etching mask that can be formed, for example, by a printing method (typically, a screen printing method) is extremely useful and noteworthy effect.

In this embodiment, by heating at the decomposition temperature of the aliphatic polycarbonate or higher, the etching mask can be very easily removed, and also a compound of a metal contained in the etching mask is formed on a layer to be etched (oxide layer) as a layer of a metal oxide by its heating. As a result, it can greatly contribute to reduction of production step of semiconductor elements represented by thin film transistors, and various devices represented by capacitors, LEDs, and electronic devices. In order to more reliably remove the etching mask by heating at the decomposition temperature of the aliphatic polycarbonate or higher, it is preferred that no other compound, composition, or material having a decomposition temperature higher than the decomposition temperature of the aliphatic polycarbonate be contained in the etching mask precursor or in the etching mask.

Moreover, in this embodiment, an aliphatic polycarbonate (s) having a molecular weight of 6,000 or more and 400,000 or less in the etching mask precursor or the etching mask constitutes 80% by mass or more of all the aliphatic polycarbonates.

(Aliphatic Polycarbonate and Solution Containing the Aliphatic Polycarbonate)

Next, by paying attention to the aliphatic polycarbonate in this embodiment, a first oxide precursor in which a compound of metal to be oxidized into a metal oxide is dispersed (i.e., an "etching mask precursor") in a solution containing a binder made of aliphatic polycarbonates (possibly including inevitable impurities. The same applies to the followings) will be described in detail.

In this embodiment, an aliphatic polycarbonate(s) of an endothermic decomposition type with excellent thermal decomposition properties is used. It is possible to confirm that the thermal decomposition reaction of the aliphatic polycarbonate is an endothermic reaction, by differential thermal analysis (DTA). Such aliphatic polycarbonates have a high oxygen content and can be decomposed into low-molecular-weight compounds at a relatively low temperature. The aliphatic polycarbonates thus positively contribute to reduction of impurities represented by carbon impurities remaining in the metal oxide.

An organic solvent adopted as the "etching mask precursor" that is a solution containing aliphatic polycarbonates is not particularly limited in this embodiment if the organic solvent allows dissolution of aliphatic polycarbonates. Specific examples of the organic solvent include diethylene-glycol-monoethyl ether acetate (hereinafter, also referred to as "DEGMEA"), α-terpineol, β-terpineol, N-methyl-2-pyrrolidone, 2-nitropropane, isopropyl alcohol, diethylene-glycol-monobutyl ether acetate, diethylene glycol monobutyl ether, toluene, cyclohexane, methyl ethyl ketone, dimethyl carbonate, diethyl carbonate, propylene carbonate, and the like. Among these organic solvents, diethylene-glycol-monoethyl ether acetate, α-terpineol, N-methyl-2-pyrrolidone, 2-nitropropane and propylene carbonate are preferably used, from the viewpoint of having an appropriately high boiling point and little evaporation at room temperature. In this embodiment, after the etching target is subjected to an etching treatment using an etching mask containing aliphatic polycarbonates, the organic solvent is eventually subjected to decomposition or removal as an impurity. From a perspective such that a pattern should be kept for relatively a short time from the formation of the pattern to the decomposition or removal thereof, a mixed solvent of DEGMEA and 2-nitropropane is preferably adopted.

Also, a dispersant, a plasticizer, and the like can be further added to the etching mask precursor that is a solution containing aliphatic polycarbonates, as desired.

Specific examples of the dispersant include:

polyhydric alcohol esters such as glycerol and sorbitan;

polyetherpolyols such as diethylene glycol, triethylene glycol, dipropylene glycol, tripropylene glycol, polyethylene glycol and polypropylene glycol; amines such as polyethyleneimine;

(meth)acrylic resins such as polyacrylic acid and polymethacrylic acid; copolymers of isobutylene or styrene and maleic anhydride, and amine salts thereof; and the like.

Specific examples of the plasticizer are polyetherpolyols and phthalate esters.

Moreover, the method of forming a layer of the etching mask precursor of this embodiment is not particularly limited. The formation of a layer by a low-energy production process is a preferred mode. More specifically, it is preferable to form a layer of the etching mask precursor by applying it to a base material by a printing method that is a particularly simple method (for example, a screen printing method).

(Aliphatic Polycarbonate)

In each experimental example described later, polypropylene carbonate is adopted as an example of aliphatic polycarbonates, but the type of aliphatic polycarbonate used in this embodiment is not particularly limited. For example, an aliphatic polycarbonate obtained by polymerization reaction between an epoxide and carbon dioxide is also a preferred mode that can be adopted in this embodiment. Use of such an aliphatic polycarbonate obtained by polymerization reaction between an epoxide and carbon dioxide exerts an effect such that an aliphatic polycarbonate having a desired molecular weight can be obtained, by which endothermic decomposition properties can be improved by controlling the structure of the aliphatic polycarbonate. Particularly, the aliphatic polycarbonate is preferably at least one member selected from the group consisting of polyethylene carbonate and polypropylene carbonate, from the viewpoint of high oxygen content and decomposition into a low molecular compound at a relatively low temperature among the aliphatic polycarbonates. In any of the aliphatic polycarbonates, effects similar to those of this embodiment can be exerted as long as the molecular weight is within the numerical range described above.

Also, the epoxide is not particularly limited as long as it is an epoxide that undergoes a polymerization reaction with carbon dioxide to form an aliphatic polycarbonate having a structure containing an aliphatic group on the main chain. Adoptable examples of the epoxide in this embodiment include ethylene oxide, propylene oxide, 1-butene oxide, 2-butene oxide, isobutylene oxide, 1-pentene oxide, 2-pentene oxide, 1-hexene oxide, 1-octene oxide, 1-decene oxide, cyclopentene oxide, cyclohexene oxide, styrene oxide, vinylcyclohexene oxide, 3-phenylpropylene oxide, 3,3,3-trifluoropropylene oxide, 3-naphthylpropylene oxide, 3-phenoxypropylene oxide, 3-naphthoxypropylene oxide, butadiene monoxide, 3-vinyloxypropylene oxide, and 3-trimethylsilyloxypropylene oxide. Among these epoxides, from the viewpoint of having high polymerization reactivity with carbon dioxide, ethylene oxide and propylene oxide are suitably used. Each of the epoxides may be used singly or in combination of two or more kinds.

The aliphatic polycarbonate mentioned above has a mass-average molecular weight of preferably from 5,000 to 1,000,000, and more preferably from 10,000 to 500,000. When the aliphatic polycarbonate mentioned above has a mass-average molecular weight of less than 5,000, for example, the aliphatic polycarbonate may not be suitable as a material for use in a printing method (typically, a screen printing method) due to, for example, a decrease in viscosity or the like. In addition, when the aliphatic polycarbonate mentioned above has a mass-average molecular weight of more than 1,000,000, the solubility of the aliphatic polycarbonate in the organic solvent is lowered, and thus the aliphatic polycarbonate may not be suitable as a material for use in the printing method also in this case. The numerical value of the mass-average molecular weight can be calculated by the following method.

Specifically, a chloroform solution having the aliphatic polycarbonate concentration of 0.5% by mass is prepared and measured using high performance liquid chromatography. After measurement, the molecular weight is calculated by comparing with polystyrene of known mass-average molecular weight measured under the same conditions. Measurement conditions are as follows.

Type: HLC-8020 (manufactured by Tosoh Corporation)
Column: GPC column (trade name of Tosoh Corporation: TSK GEL Multipore HXL-M)
Column temperature: 40° C.
Eluate: chloroform
Flow speed: 1 mL/min In addition, as an example of the method of producing the aliphatic polycarbonate, a method of performing a polymerization reaction between the epoxide and carbon dioxide in the presence of a metal catalyst or the like can be adopted.

Here, a production example of an aliphatic polycarbonate is as follows.

The atmosphere of the system of 1 autoclave equipped with a stirrer, a gas introduction tube, and a thermometer was replaced in advance with a nitrogen atmosphere, and was then charged with a reaction solution containing an organozinc catalyst, hexane, and propylene oxide. Next, carbon dioxide was added while stirring to replace the atmosphere of the reaction system with a carbon dioxide atmosphere, and carbon dioxide was filled until the pressure inside of the reaction system reached about 1.5 MPa. Thereafter, the temperature of the autoclave was raised to 60° C., and polymerization reaction was carried out for several hours while replenishing carbon dioxide consumed by the reaction. After completion of the reaction, the autoclave was cooled and depressurized, and the content was filtered. Thereafter, the filtered product was dried under reduced pressure to obtain polypropylene carbonate.

Also, specific examples of the metal catalyst are aluminum catalysts or zinc catalysts. Among them, a zinc catalyst is preferably used since it has high polymerization activity in the polymerization reaction between an epoxide and carbon dioxide. Among zinc catalysts, an organozinc catalyst is particularly preferably used.

In addition, specific examples of the organozinc catalysts include:

organozinc catalysts such as zinc acetate, diethyl zinc, and dibutyl zinc;

organozinc catalysts obtained by reacting a compound such as a primary amine, a divalent phenol, a divalent aromatic carboxylic acid, an aromatic hydroxy acid, an aliphatic dicarboxylic acid or an aliphatic monocarboxylic acid with a zinc compound; and the like.

Among these organozinc catalysts, it is a preferred mode to adopt an organozinc catalyst obtained by reacting a zinc compound, an aliphatic dicarboxylic acid, and an aliphatic monocarboxylic acid, because of having a higher polymerization activity.

Here, a production example of the organozinc catalyst is as follows.

First, a four-necked flask equipped with a stirrer, a nitrogen gas introduction tube, a thermometer, and a reflux condenser was charged with zinc oxide, glutaric acid, acetic acid, and toluene. Next, after replacing the atmosphere of the reaction system with a nitrogen atmosphere, the temperature of the flask was raised to 55° C., and the mixture was stirred at the same temperature for 4 hours to carry out the reaction treatment of each of the materials. Then, the temperature was raised to 110° C., and the mixture was further stirred at the same temperature for 4 hours and azeotropically dehydrated to remove only moisture. Thereafter, the flask was cooled to room temperature to obtain a reaction solution containing an organozinc catalyst. A part of this reaction solution was collected and filtrated, and IR measurement was carried out (trade name: AVATAR360, manufactured by Thermo Nicolet Japan Inc.) for the obtained organozinc catalyst. As a result, no peak based on carboxylic groups was confirmed.

The amount of the metal catalyst used in the polymerization reaction is preferably 0.001 to 20 parts by mass, and more preferably 0.01 to 10 parts by mass, with respect to 100 parts by mass of the epoxide. When the amount of the metal catalyst used is less than 0.001 parts by mass, the polymerization reaction may not proceed easily. In addition, when the amount of the metal catalyst used exceeds 20 parts by mass, effects in accordance with the amount of use may not be obtained, which may be economically undesirable.

A reaction solvent to be used as necessary in the polymerization reaction is not particularly limited. As this reaction solvent, various organic solvents can be applied. Specific examples of this organic solvent include:

aliphatic hydrocarbon solvents such as pentane, hexane, octane, decane, and cyclohexane;

aromatic hydrocarbon solvents such as benzene, toluene and xylene; halogenated hydrocarbon solvents such as chloromethane, methylene dichloride, chloroform, carbon tetrachloride, 1,1-dichloroethane, 1,2-dichloroethane, ethyl chloride, trichloroethane, 1-chloropropane, 2-chloropropane, 1-chlorobutane, 2-chlorobutane, 1-chloro-2-methylpropane, chlorobenzene and bromobenzene;

carbonate-based solvents such as dimethyl carbonate, diethyl carbonate, and propylene carbonate; and the like.

From the viewpoint of facilitating the reaction, the amount of the reaction solvent used is preferably 500 parts by mass or more and 10,000 parts by mass or less, with respect to 100 parts by mass of the epoxide.

Also, in the polymerization reaction, there is no particular limitation on the method of reacting the epoxide and carbon dioxide in the presence of a metal catalyst. For example, a method of charging the epoxide, the metal catalyst, and, if necessary, the reaction solvent into an autoclave, mixing them, and then injecting carbon dioxide under pressure thereinto for reaction can be adopted.

In addition, the pressure of carbon dioxide used in the polymerization reaction is not particularly limited. Typically, the pressure is preferably 0.1 MPa to 20 MPa, more preferably 0.1 MPa to 10 MPa, and further preferably 0.1 MPa to 5 MPa. When the pressure of carbon dioxide exceeds 20 MPa, effects in accordance with the pressure may not be obtained, which may be economically undesirable.

Furthermore, the polymerization reaction temperature in the polymerization reaction is not particularly limited. Typically, it is preferably from 30 to 100° C., and more preferably from 40 to 80° C. When the polymerization reaction temperature is lower than 30° C., it may take a long time for the polymerization reaction. In addition, when the polymerization reaction temperature exceeds 100° C., a side reaction may occur and the yield may decrease. Since the polymerization reaction time varies depending on the polymerization reaction temperature, it cannot be said unconditionally, but typically it is preferably 2 hours to 40 hours.

After completion of the polymerization reaction, aliphatic polycarbonate can be obtained by filtering the reactant by filtration or the like, and washing with a solvent or the like if necessary, followed by drying.

(Etching Mask and Laminate)

Next, a laminate obtained by placing a pattern (i.e., "etching mask") of the first oxide precursor layer formed from the first oxide precursor (i.e., "etching mask precursor") on the oxide layer to be etched will be described.

In the first oxide precursor in this embodiment, a compound of metal to be oxidized into a metal oxide is dispersed in a solution containing a binder made of the aliphatic polycarbonates. Here, an example of the compound of metal to be oxidized into a metal oxide is a material having a structure (typically, a complex structure) in which a ligand is coordinated to the metal to be oxidized into a metal oxide. In this embodiment, a more specific example of the compound of metal is zirconium butoxide.

Also, an example of the oxide layer to be etched is indium-zinc oxide. This indium-zinc oxide is an example of an oxide semiconductor. In this embodiment, a state in which a compound of metal to be oxidized into a metal oxide is dispersed in a solution containing a binder made of the aliphatic polycarbonates is a "second oxide precursor". Here, an example of the compound of metal to be oxidized into a metal oxide is indium acetylacetonate and zinc chloride. For example, a layer (InZn solution layer) is formed from a solution (also referred to as "InZn solution") obtained by dissolving indium acetylacetonate and zinc chloride in propionic acid containing aliphatic polycarbonates, using a spin coating method, blade coating, slit coating, or the like. The InZn solution layer is an example of the second oxide precursor layer. Thereafter, by performing an annealing step of heating the InZn solution layer at 450° C. to 550° C. for a predetermined time (for example, 10 minutes to 1 hour) in the air, an indium-zinc oxide (also referred to as "InZnO") layer (oxide layer) that is an oxide semiconductor can be formed.

In the laminate of this embodiment, first, a first oxide precursor (etching mask precursor) obtained by dissolving zirconium butoxide in DEGMEA (solvent) containing the aliphatic polycarbonates is prepared. At the time of producing the first oxide precursor at normal temperature, a paste is formed to such an extent that it can be applied using, for example, a screen printing method.

Thereafter, a pattern forming step of forming a pattern of a first oxide precursor layer that is an etching mask, on a layer of InZnO (oxide layer) 44 to be etched, is performed by a known method. FIGS. 1A, 2A, 3A and 4A are schematic sectional views showing a process in the method of producing a laminate of this embodiment. Also, FIGS. 1B, 2B, 3B and 4B are optical photographs by an optical microscope in a plan view, showing the process in the method of producing a laminate of this embodiment, corresponding to FIGS. 1A, 2A, 3A and 4A, respectively.

FIGS. 1A and 1B show a laminate 100 when a pattern 80 of a first oxide precursor layer is formed on an oxide layer 44 formed on a substrate 10 (for example, a glass or quartz substrate), for example, by a screen printing method. The pattern forming step of this embodiment is not limited to the forming step of a pattern by a printing method. For example, a pattern forming step of forming the pattern 80 by a photolithography method is also an adoptable mode. However, from the viewpoint of reducing energy consumption in the production process of the laminate 100 as much as possible, adoption of a printing method that is a low-energy production process is a preferred mode.

Subsequently, by using the pattern 80 of the first oxide precursor layer as an etching mask, an etching step of forming a pattern of the oxide layer 44 is performed. Specifically, the pattern 80 and the oxide layer 44 are brought into contact (typically, immersed in the etching solution) with a commercially available etching solution (model "ITO-02", manufactured by KANTO CHEMICAL CO., INC.) that is a solution capable of dissolving a second oxide precursor layer (contact step). As a result, as shown in FIGS. 2A and 2B, the oxide layer 44 that is not protected by a pattern of the pattern 80 is etched and thus removed. On the other hand, the oxide layer 44 protected by the pattern of the pattern 80 remains on the substrate 10 without being etched.

Thereafter, in order to decompose mainly aliphatic polycarbonates among the components contained in the pattern 80, a heating step (also referred to as "preliminary annealing step" in this embodiment) is performed at a predetermined temperature (first temperature).

In the preliminary annealing step of this embodiment, heating is performed at a first temperature at which 90 wt % or more of aliphatic polycarbonates is decomposed. By the combination of the preliminary annealing step and the main annealing (annealing step) to be described later, it is possible to eliminate most of impurities represented by carbon impurities particularly caused by the aliphatic polycarbonates, in the pattern 80. From the viewpoint of more reliably suppressing remaining of impurities represented by carbon impurities particularly caused by the aliphatic polycarbonates in the oxide layer 44, the first temperature is preferably a temperature at which 95 wt % or more of the aliphatic polycarbonates is decomposed, and further preferably a temperature at which 99 wt % or more of the aliphatic polycarbonates is decomposed.

Here, the preliminary annealing step is not limited to drying at normal temperature under normal pressure. For example, treatment such as heating or decompressing such as drying by heating, decompression drying, or decompression drying by heating, as long as the substrate, the gate insulator, and the like are not adversely affected. Although the preliminary annealing step is a step that can influence the increase or decrease in surface roughness of the oxide semiconductor layer. Because behavior during drying differs depending on the solvent, conditions such as the temperature (first temperature) in the preliminary annealing step are selected appropriately in accordance with the type of the solvent.

In the preliminary annealing step of this embodiment as an example, the oxide layer 44 is heated, for example, in the range of 180° C. or more and 300° C. or less, for a predetermined time (for example, 30 minutes). Incidentally, the preliminary annealing is carried out, for example, in an oxygen atmosphere or in the air (hereinafter also collectively referred to as "oxygen-containing atmosphere"). It is also an adoptable mode that the preliminary annealing step is carried out in a nitrogen atmosphere. Also, according to the research of the inventors of this application, it has been confirmed that the first temperature can realize a temperature lower than the temperature when heating without irradiation with ultraviolet rays by several tens of degrees (for example, about 30° C.), by heating (for example, with a known heater) while irradiation with ultraviolet rays (for example, ultraviolet rays having wavelengths of 185 nm and 254 nm, using a known low pressure mercury lamp (manufactured by SAMCO Inc., model: UV-300H-E)). Therefore, in the heating step (preliminary annealing step) for decomposing the aliphatic polycarbonates, while irradiating the second oxide precursor layer to be etched and/or the pattern 80 as an etching mask with ultraviolet rays, it is preferable to heat to a temperature equal to or higher than the temperature at which an organic substance, for example, the organic solvent, an organic portion of the complex structure or the aliphatic polycarbonates are decomposed. This is because it is preferred that the finally formed oxide layer contain the organic portion in the solute, the solvent or the aliphatic polycarbonate as little as possible. In addition, it is a more preferred mode that the temperature is equal to or higher than the temperature at which each of the oxide layers is formed. The wavelength of the ultraviolet ray is not particularly limited. Similar effects can be exerted even with ultraviolet rays having wavelengths other than 185 nm or 254 nm.

When the preliminary annealing step is carried out, as shown in FIGS. 3A and 3B, among the components contained in the pattern 80, it is set to a state that the first oxide precursor layer 82 before main annealing obtained as a result of disappearance of almost all of the aliphatic polycarbonates by decomposition, is placed on the oxide layer 44 on which the pattern is formed.

Thereafter, as main annealing, that is, an "annealing step", the first oxide precursor layer 82 and the oxide layer 44 before main annealing are heated, for example, at 180° C. or more, more preferably 250° C. or more, and further preferably 300° C. or more, in addition, in terms of electrical characteristics, extremely preferably in the range of 500° C. or more, for a predetermined time, in an oxygen-containing atmosphere.

As a result, the first oxide precursor layer 82 before main annealing becomes a first oxide layer 84 by heat treatment in the main annealing step. In this embodiment, the first oxide layer 84 is a layer of zirconium oxide (also referred to as "$ZrO_2$") that is an oxide insulator. By the main annealing, as shown in FIGS. 4A and 4B, a laminate 200 in which the first oxide layer 84 is placed on the oxide layer 44 is produced by decomposition and/or removal of the aliphatic polycarbonates constituting a part of the etching mask.

In this embodiment, it is to be noted that aliphatic polycarbonates constituting a part of the pattern 80 (i.e., the etching mask) are decomposed and/or removed by the main annealing step. It is further noted that, by the main annealing step, the pattern 80 of the first oxide precursor layer remains as a functional layer (the first oxide layer 84) after a paste or solution containing aliphatic polycarbonates finishes its role as the etching mask, so that it is possible to extremely easily realize the formation of the laminate 200 by so-called self-alignment. Therefore, utilization of the pattern 80 of the first oxide precursor layer leads to a remarkable reduction of production step, so that it is possible to realize the production of the laminate 200 at low cost and low energy consumption.

The final thickness of the oxide layer 44 after main annealing is typically 0.01 μm or more and 10 μm or less. In particular, it is also worth noting that cracks are unlikely to occur even when extremely thin layers of about 0.01 μm (i.e., about 10 nm) are formed.

Here, as the preset temperature in the main annealing step, a temperature at which the metal and oxygen are bonded after decomposing a ligand of the oxide semiconductor in the process of forming the first oxide layer 84, that is also a temperature (second temperature) equal to or higher than the temperature of the exothermic peak value in the differential thermal analysis (DTA) is selected. By this annealing step, the aliphatic polycarbonate, the dispersant, and the organic solvent in the pattern 80 of the first oxide precursor layer are decomposed and/or removed more reliably. It is a preferred mode that the second temperature is higher than the first temperature by 10° C. or more, from the viewpoint of suppressing remaining of impurities represented by carbon impurities in the oxide semiconductor layer after main annealing. In addition, when the second temperature is higher than the first temperature by 50° C. or more, it is made possible to more reliably suppress the remaining of such impurities. Moreover, it is the most preferred example that the second temperature is higher than the first temperature by 100° C. or more, from the viewpoint of realization of controllability of the thickness and/or reduction of thickness of the final oxide semiconductor layer, and reduction of remaining impurities. Meanwhile, the maximum difference between the second temperature and the first temperature is not particularly limited.

According to the analysis by the present applicants, it is considered that the aliphatic polycarbonates are mostly decomposed by heating at the first temperature, so that almost no decomposition process of the aliphatic polycarbonates takes place and a reaction almost specialized for bonding between the metal and oxygen is performed in the subsequent annealing step (main annealing) at the second temperature. That is, ideally, it is considered that cracks will be unlikely to be generated even in a very thin layer as described above, by differentiating the roles of the first temperature and the second temperature.

Incidentally, when an etching treatment was performed using the pattern 80 of the first oxide precursor layer of this embodiment, rectifying properties as the semiconductor (channel) of the oxide layer 44 to be protected by the pattern 80 could be confirmed. However, particularly interestingly, it was confirmed that there is a case where the oxide layer 44 using a commercially available resist as an etching mask does not show rectifying properties as a channel, even though the conditions other than the material of the etching mask are the same. Therefore, in order to more reliably realize rectifying properties as the channel of the oxide layer 44, it is preferable to perform an etching treatment using the pattern 80 of the first oxide precursor layer.

<Modification Example (1) of First Embodiment>

In this embodiment, a laminate 100' obtained by placing a pattern 80 (i.e., "etching mask") of a first oxide precursor layer formed from the first oxide precursor (i.e., "etching mask precursor") in the first embodiment, on a second oxide precursor layer 42 to be oxidized into an oxide layer 44 as the etching target, instead of the oxide layer 44 of the first embodiment, will be described.

FIGS. 5 to 8 are schematic sectional views showing a process in a method of producing a laminate of the present modification example.

In this embodiment, the second oxide precursor layer 42 (for example, an InZn solution layer) is applied to a substrate 10 by, for example, a spin coating method.

Thereafter, as a preliminary annealing (also referred to as "first preliminary annealing") step, heating is performed, for example, at 150° C. for a predetermined time (for example, several minutes to 30 minutes) to form a second oxide precursor layer 42 having a thickness of about 60 nm. This first preliminary annealing step is primarily intended to promote gelation of the second oxide precursor layer 42 and fix it.

Subsequently, as shown in FIG. 5, a pattern 80 of a first oxide precursor layer is formed on the second oxide precursor layer 42 by a printing method (for example, a screen printing method) to form a laminate 100' (pattern forming step).

Thereafter, by using the pattern 80 as an etching mask, an etching step of forming a pattern of the second oxide precursor layer 42 is performed. Specifically, the pattern 80 and the second oxide precursor layer 42 are brought into contact (typically, immersed in the etching solution) with a commercially available etching solution (model "ITO-02", manufactured by KANTO CHEMICAL CO., INC.) that is a solution capable of dissolving a second oxide precursor layer (contact step). As a result, as shown in FIG. 6, the second oxide precursor layer 42 that is not protected by the pattern of the pattern 80 is etched and thus removed. On the other hand, the second oxide precursor layer 42 protected by the pattern of the pattern 80 remains on the substrate 10 without being etched.

Thereafter, in order to decompose the aliphatic polycarbonates in the pattern 80 and the second oxide precursor layer 42 on which the pattern is formed, a heating step (second preliminary annealing step) is performed at a predetermined temperature (first temperature).

In the second preliminary annealing step of this embodiment, similarly to the first embodiment, at least 90 wt % or more of the aliphatic polycarbonates in the pattern 80 and the second oxide precursor layer 42 on which the pattern is formed will be decomposed, by the "first temperature" in the first embodiment. As described in the first embodiment, for example, the first temperature can realize a temperature lower than the temperature when heating without irradiation with ultraviolet rays by several tens of degrees (for example, about 30° C.), by heating while irradiation with the ultraviolet rays described in the first embodiment.

When the preliminary annealing step is carried out, as shown in FIG. 7, it is set to a state that the first oxide precursor layer 82 before main annealing, obtained as a result of disappearance by decomposition of almost all of the aliphatic polycarbonates in the pattern 80 and the second oxide precursor layer 42 on which the pattern is formed, is placed on the second oxide precursor layer 42 on which the pattern is formed.

Thereafter, as main annealing, that is, an "annealing step", the first oxide precursor layer 82 and the second oxide precursor layer 42 before main annealing are heated, for example at 180° C. or more, more preferably 250° C. or more, and further preferably 300° C. or more, in addition, in terms of electrical characteristics, extremely preferably in the range of 500° C. or more, for a predetermined time, in an oxygen-containing atmosphere.

As a result, the first oxide precursor layer 82 before main annealing becomes a first oxide layer 84 by heat treatment in the main annealing step. Further, by the heat treatment in the main annealing step, the second oxide precursor layer 42 becomes an oxide layer 44. In this embodiment, the first oxide layer 84 is a layer of $ZrO_2$ that is an oxide insulator. By the main annealing, as shown in FIG. 8, a laminate 200' in which the first oxide layer 84 is placed on the oxide layer 44 is produced by decomposition and/or removal of the aliphatic polycarbonates constituting a part of the etching mask.

According to the first embodiment and Modification Example (1) of the first embodiment, since a layer containing a metal oxide (the first oxide layer 84) using a metal compound as a starting material can be selectively formed by using the pattern 80, on the oxide layer 44 that is an underlying layer, the laminate 200, 200' or a laminated structure can be extremely easily produced by so-called self-alignment.

Here, the etching target by the pattern 80 in the first embodiment and Modification Example (1) of the first embodiment includes not only an oxide semiconductor but also an oxide conductive material or an oxide insulator, or other semiconductor materials, conductor materials, and insulator materials.

<Modification Example (2) of First Embodiment>

Furthermore, by combining the steps adopted above and in the respective embodiments, a laminate or laminated structure having a three-layer structure or more can be also produced. Therefore, mixing metal compounds in the pattern 80 of the first oxide precursor layer that also serves as an etching mask realizes a laminate or a laminated structure of a plurality of types of metal oxides having different electrical characteristics or other physical properties, and also having desired patterns, and thus it is a preferred mode that can be adopted. By using the first embodiment and Modification Example (1) of the first embodiment, the pattern 80 of the first oxide precursor layer can be used as a starting material for a layer to be selectively formed on the layer to be etched or thereabove (in the case of a multilayer structure).

<Modification Example (3) of First Embodiment>

By the way, formation of a layer by various printing methods described above, particularly, a printing method (for example, a screen printing method) that is highly applicable to various devices represented by semiconductor elements and electronic devices, currently attract great attention in industry, from the viewpoint of flexibility of the devices including such a layer, and the industrial or mass productivity.

However, for example, there is a difference between the thickness of a layer formed by a printing method (for example, a screen printing method) and the thickness (typically, submicron) of a layer (for example, an etching mask) required for producing the various devices represented by semiconductor elements. Specifically, while a comparatively thick layer is formed during patterning using a printing method, the thickness required for the etching mask can vary greatly depending on the material of the film to be etched or its thickness.

Since a paste or solution used in the printing method has a suitable viscosity for performing patterning, its viscosity is adjusted by a polymer compound. The inventors of this application have confirmed that, when an etching mask used for producing various devices is formed by using a paste or solution containing aliphatic polycarbonates, for example, by a printing method (for example, a screen printing method), a situation that the stringiness of the aliphatic polycarbonates cannot be controlled as appropriate can take place. Therefore, there may arise a problem that a good pattern of an etching mask that can be used in the production step of the various devices or suitable for producing the various devices cannot be formed.

More specifically, a problem of disturbing a desired pattern can arise, since, in the process of forming the pattern 80 of the first oxide precursor layer, which is the etching mask, by a printing method, the precursors are partially drawn out into strands from the pattern 80 formed on the oxide layer 44 to be etched or the second oxide precursor layer 42 to be etched.

In addition, when the pattern 80 is formed, for example, by a printing method, the shape of the pattern once formed needs to be maintained until at least the material to be etched or the region is removed. Therefore, formation of a pattern which hardly changes with time can be also said to be one of the problems required particularly in the printing method.

On the other hand, realizing an etching mask for forming a pattern without impairing the function of a thin layer constituting various devices represented by semiconductor elements, as described above, can be also said to be one of element technologies for realizing the thin layer.

As a result of many trials and errors and analysis, the inventors of this application have confirmed that the inclusion of an aliphatic polycarbonate having a certain range of molecular weight or specific stringiness can contribute to the realization of a pattern having a desired thickness capable of constituting an etching mask extremely suitable, for example, for a printing method (typically, a screen printing method). In addition, the inventors of this application have found that a desired pattern of a gel layer capable of controlling the thickness can be easily formed by a low-energy production process represented by a printing method.

Therefore, it is a more preferred mode to adopt an oxide (for example, metal oxide) formed by annealing a starting material which is an oxide precursor that is difficult to form by a printing method (for example, a screen printing method) to a temperature equal to or higher than the temperature at which the oxide is formed, that is, a temperature equal to or higher than the temperature at which an element dispersed in a solution containing aliphatic polycarbonates and oxygen bond to each other, together with adoption of the pattern 80 of the first oxide precursor layer. This is because the temperature at which the oxide is formed is higher than the temperature at which the aliphatic polycarbonates in the pattern 80 are decomposed, and thus the aliphatic polycarbonates have already been decomposed and removed more reliably when the oxide is formed. As a result, at least the following effects (1) and (2) can be obtained.

(1) Effect of step reduction that it is unnecessary to separately perform the step of removing the pattern 80

(2) Effect of maintaining or improving, especially, electrical characteristics of oxide that it is possible to suppress or eliminate the influence on the physical properties of the oxide to be etched, due to, for example, exposure to oxygen plasma or contact (typically, immersion) with a chemical solution for removal of the resist mask Obtaining the effects can contribute to further improvement in the performance of various devices represented by semiconductor elements and electronic devices produced using an etching mask capable of controlling the thickness, as well as production technology therefor.

[Correlation Between Molecular Weight of Aliphatic Polycarbonate, and Stringiness and Shape of Pattern]

Based on the studies and analysis, the inventors of this application performed the following experiments, in order to realize the pattern 80 of the first oxide precursor layer that is more suitable for a printing method.

The inventors of this application thoroughly analyzed and studied on correlation between the molecular weight of the aliphatic polycarbonate, and stringiness and shape of pattern, typically by performing the following experiments. As a result, as a representative example of the molecular weight of the aliphatic polycarbonate, the inventors of this application confirmed that, when an aliphatic polycarbonate(s) having 6,000 or more and 400,000 or less constitutes 80% by mass or more of all the aliphatic polycarbonates, stringiness of the etching mask in "gel state" can be controlled and a good pattern can be formed. The aliphatic polycarbonate adopted in each of the following experimental examples is polypropylene carbonate (hereinafter, also referred to as "PPC").

(Preparation Step for Each Experiment)

In addition, production examples of an oxide precursor (first oxide precursor or second oxide precursor) are as follows. In each of the following experimental examples, typically, a precursor to be oxidized into an oxide semiconductor, that is, an oxide semiconductor precursor is adopted as a first oxide precursor or a second oxide precursor.

Initially, indium acetylacetonate and propionic acid were gradually mixed into a 50 mL flask while stirring to obtain an indium-containing solution which would eventually become an indium oxide.

Next, polypropylene carbonate was dissolved in a mixed solvent of DEGMEA and 2-nitropropane in a 50-mL recovery flask to obtain a 25 wt % polypropylene carbonate solution.

Thereafter, the indium-containing solution was gradually added to the solution of polypropylene carbonate to obtain an oxide semiconductor precursor (first oxide precursor).

EXPERIMENTAL EXAMPLE 1

Samples in which four types of PPCs having different mass-average molecular weights were dissolved, or samples in which a combination of any two types thereof were dissolved were prepared as shown in the following (1) to (10).

(1) Only PPC having a mass-average molecular weight of 30,000 (hereinafter, also referred to as "Sample A")

(2) Only PPC having a mass-average molecular weight of 90,000 (hereinafter, also referred to as "Sample B")

(3) A mixture of Sample A and Sample B at a ratio of 1:1 (hereinafter, also referred to as "Sample AB")

(4) Only PPC having a mass-average molecular weight of 230,000 (hereinafter, also referred to as "Sample C")

(5) Only PPC having a mass-average molecular weight of 590,000 (hereinafter, also referred to as "Sample D")

(6) A mixture of Sample C and Sample D at a ratio of 1:1 (hereinafter, also referred to as "Sample CD")

(7) A mixture of Sample A and Sample C at a ratio of 1:1 (hereinafter, also referred to as "Sample AC")

(8) A mixture of Sample B and Sample C at a ratio of 1:1 (hereinafter, also referred to as "Sample BC")

(9) A mixture of Sample A and Sample D at a ratio of 1:1 (hereinafter, also referred to as "Sample AD")

(10) A mixture of Sample B and Sample D at a ratio of 1:1 (hereinafter, also referred to as "Sample BD")

For the samples, the percentage of an aliphatic polycarbonate having a molecular weight of 6,000 or more and 400,000 or less in all the aliphatic polycarbonates was determined as follows. That is, a chloroform solution having an aliphatic polycarbonate concentration of 0.5% by mass is prepared, and the molecular weight distribution is measured by comparing it with polystyrene of known molecular weight using high-performance liquid chromatography under the following measurement conditions.

Type: HLC-8020 (manufactured by Tosoh Corporation)
Column: GPC column (trade name of Tosoh Corporation: TSK GEL Multipore HXL-M)
Column temperature: 40° C.
Eluate: chloroform
Flow speed: 1 mL/min From the chromatogram obtained by the above method wherein the horizontal axis denotes molecular weight (log molecular weight) and the vertical axis denotes elution ratio (dwt/d (log molecular weight)), the percentage of the area of the entire chromatogram region in the area of the molecular weight range of 6,000 or more and 400,000 or less was calculated. The obtained results are shown in Table 1.

TABLE 1

| Table 1 | |
| --- | --- |
| Sample | Percentage (% by mass) of aliphatic polycarbonate having molecular weight of 6,000 or more and 400,000 or less |
| (1) | 81 |
| (2) | 93 |

TABLE 1-continued

Table 1

| Sample | Percentage (% by mass) of aliphatic polycarbonate having molecular weight of 6,000 or more and 400,000 or less |
|---|---|
| (3) | 87 |
| (4) | 79 |
| (5) | 58 |
| (6) | 69 |
| (7) | 80 |
| (8) | 86 |
| (9) | 70 |
| (10) | 76 |

The stringiness of the binder was evaluated using the above samples. Specifically, rectangular patterns of the binder were formed on glass substrates "Eagle XG" (200× 150×0.7 tmm$^3$) by a screen printing method.

Thereafter, preliminary annealing was performed on the pattern at 150° C. for 30 minutes in an air atmosphere, and then the stringiness of the pattern was evaluated using an optical microscope and an atomic force microscope (AFM).

The summary of the above experimental results is shown in Table 2.

TABLE 2

| Sample | Shape of pattern | Stringiness | Height of pattern (μm) |
|---|---|---|---|
| (1) | Good | Good | 1.4 |
| (2) | Good | Good | 1.5 |
| (3) | Good | Good | 1.8 |
| (4) | Good | Bad | 2.6 |
| (5) | Bad | Bad | 4 |
| (6) | Bad | Bad | Unmeasurable |
| (7) | Good | Good | 2.1 |
| (8) | Good | Good | 2.1 |
| (9) | Bad | Bad | 5.3 |
| (10) | Bad | Bad | 5.3 |

"Shape of pattern" in Table 2 indicates the fidelity of a pattern formed using a printing method. Therefore, the expression "bad" in "shape of pattern" means a situation in which a pattern is not formed to such an extent that it cannot be used for producing a device. On the contrary, the expression "good" in "shape of pattern" means that a pattern is reproduced to such an extent that it can be used for producing a device. In addition, the expression "bad" in "stringiness" in Table 2 means a state in which a part of the binder is drawn out into strands from the layer of the binder in which a pattern is formed using the printing method, whereby the desired pattern is destroyed. Furthermore, the expression "good" in "stringiness" means a state in which little or no stringiness is observed. In addition, "height of pattern" in Table 2 is a measured value of the highest point of the pattern by atomic force microscope (AFM). Here, the expression "unmeasurable" in the "height of pattern" of Sample (6) means a situation in which the pattern itself was not substantially formed.

In addition to Table 2 above, the results of the above (1), (7), and (8) are shown in FIG. 9, as examples of typical optical photomicrographs in which a good pattern can be realized. Further, the results of the above (5), (9), and (10) are shown in FIG. 10A, as examples of typical optical photomicrographs in which stringiness cannot be controlled and an unfavorable pattern is formed.

As shown in Table 2, FIG. 9, and FIG. 10A, (1) "Sample A", (2) "Sample B" and (3) "Sample AB", that are aliphatic polycarbonates of relatively low molecular weight, and (7) "Sample AC" of an aliphatic polycarbonate having medium molecular weight obtained good results with respect to "shape of pattern" and "stringiness". In particular, although the stringiness of Sample C ((4) in the table) is expressed as "bad" in Table 2, stringiness was found only in a part of the pattern.

In addition, the result that the "shape of patterning" or "stringiness" deteriorates is thought to be due to an increase in molecular weight was obtained. Meanwhile, for example, in a printing method (for example, a screen printing method), it is preferred that the formed pattern have a "height" equal to or higher than a certain level. Therefore, it was found that adoption of an aliphatic polycarbonate of very low molecular weight is not preferred in order to obtain a "height of pattern" at a level or higher than a certain level while maintaining good "shape of pattern" and "stringiness".

Here, the inventors of this application consider the cause of the "shape of patterning" and "stringiness" of each of (9) "Sample AD" and (10) "Sample BD" became "bad" as follows.

As shown in "height of pattern" in Table 2, each height of pattern (5.3 μm) of (9) "Sample AD" and (10) "Sample BD" is almost the same as the sum of the height of pattern (1.4 μm) of "Sample A" and the height of pattern (4 μm) of "Sample D", or the sum of the height of pattern (1.5 μm) of "Sample A" and the height of pattern (4 μm) of "Sample D". Therefore, in the case of using a sample prepared by dissolving PPC alone as a binder, it is considered that, when a certain degree of difference in molecular weight is exceeded, a situation where high-molecular-weight aliphatic polycarbonates and low-molecular-weight aliphatic polycarbonates are immiscible due to so-called phase separation is formed. More specifically, there can be a situation where high-molecular-weight aliphatic polycarbonates are placed on low-molecular-weight aliphatic polycarbonates, or a state opposite thereto. Meanwhile, (7) "Sample AC" or (8) "Sample BC" having relatively a small difference in molecular weight are considered to be in a state in which the high-molecular-weight aliphatic polycarbonates and the low-molecular-weight aliphatic polycarbonates are mixed appropriately without undergoing so-called phase separation, and thus it is considered that good "shape of patterning" and "stringiness" can be obtained.

Therefore, the experimental results can be said to indicate that, even when the same kind of materials are used, when a plurality of aliphatic polycarbonates having different mass-average molecular weights are used, it is not possible to derive a molecular weight appropriate for obtaining good "shape of patterning" and "stringiness", simply by averaging the mass-average molecular weight of each aliphatic polycarbonate.

Combining each of the results and the results of investigation and analysis on other molecular weights by the inventors of this application, good "shape of pattern" and "stringiness" can be realized by adopting an aliphatic polycarbonate in which an aliphatic polycarbonate(s) having a molecular weight of 6,000 or more and 400,000 or less constitutes 80% by mass or more of all the aliphatic polycarbonates.

In addition, it has been confirmed that the results shown in (1) to (10) above apply as the tendency of data even when a sample of an oxide semiconductor precursor described in the "Preparation Step for Each Experiment", obtained by dissolving each of four types of PPCs having different mass-average molecular weights as a binder, or a sample of the oxide semiconductor precursor obtained by dissolving a combination of two types of these PPCs as a binder is prepared. Incidentally, the sample of the oxide semiconductor precursor contains 5% by mass of a 0.2 mol/kg indium-containing solution. In addition, the same number is used for each sample number in Table 3, in order to make the correspondence relationship with (1) to (10) in Table 1 easy to understand.

Specifically, as shown in Table 3, (1) "Sample A", (2) "Sample B" and (3) "Sample AB", that are aliphatic polycarbonates of relatively low molecular weight, and (7) "Sample AC" of an aliphatic polycarbonate having medium molecular weight obtained good results with respect to "shape of pattern" and "stringiness". Interestingly, it was confirmed that the shape of pattern and stringiness of each sample of (9) and (10) having relatively large molecular weight were also good. FIG. 10B shows optical photomicrographs showing the results of (9) and (10) in which a good pattern was formed as a result of successful control of stringiness. The reason of the good shape of pattern and stringiness of each sample of (9) and (10) is probably due to the addition of an indium-containing solution to a sample adopted in Table 2, leading to a slight decrease in PPC concentration as a whole.

TABLE 3

| Sample | Shape of pattern | Stringiness | Height of pattern (μm) |
|---|---|---|---|
| (1) | Bad | Good | 1 |
| (2) | Bad | Good | Unmeasurable |
| (3) | Good | Good | 1.2 |
| (4) | Bad | Bad | 4.4 |
| (5) | Bad | Bad | Unmeasurable |
| (6) | Bad | Bad | Unmeasurable |
| (7) | Good | Good | 3.2 |
| (8) | Good | Good | 2.6 |
| (9) | Good | Good | 3.7 |
| (10) | Good | Good | 5.3 |

EXPERIMENTAL EXAMPLE 2

Next, the inventors of this application measured the average length of drawn-out strands (mm) and zero-shear viscosity (Pa·s) of samples shown in (1) to (10) corresponding to Table 3 adopted in Experimental Example 1 by the following experiment. Therefore, in this experiment, a sample of an oxide semiconductor precursor described in the "Preparation Step for Each Experiment", obtained by dissolving each of four types of PPCs having different mass-average molecular weights as a binder, or a sample of the oxide semiconductor precursor obtained by dissolving a combination of two types thereof as a binder is adopted.

In this experiment, first, regarding the average length of drawn-out strands (mm), a cylindrical bar made of polytetrafluoroethylene and having a diameter D of 2.9 mm was dipped in a collection of aliphatic polycarbonates in a container, which had been formed using each sample. Thereafter, the length L (mm) of drawn-out strand from the outermost surface of the collection of aliphatic polycarbonates when the cylindrical bar was pulled up at a velocity "v" of 5 mm/sec was measured. In addition, the zero-shear viscosity η of each sample was measured using a rheometer (TA Instruments, AR-2000EX). Then, as the evaluation parameter, each of the values was substituted into the following formula for calculation.

<Calculation Formula>

"Evaluation parameter" $(mm^{-1} \cdot Pa^{-1}) = L/(D \times v \times \eta)$

Table 4 shows the relationship between each sample, and average length of drawn-out strands (mm) and zero-shear viscosity (Pa·s) in this experimental example. Further, FIG. 11 is a graph showing the relationship between each sample and the evaluation parameter showing stringiness in this experimental example.

As shown in Table 4 and FIG. 11, it was found that, when the value of "evaluation parameter" $(mm^{-1} \cdot Pa^{-1})$ calculated by the calculation formula is at least 0.25 $mm^{-1} \cdot Pa^{-1}$ (more narrowly 0.29 $mm^{-1} Pa^{-1}$ or more), good "shape of patterning" and "stringiness" can be obtained. Also, the upper limit value of the "evaluation parameter" for obtaining good "shape of patterning" and "stringiness" is not particularly limited, and from the viewpoint of more reliably obtaining the height of the pattern, the value of the "evaluation parameter" is preferably 1.2 or less (more narrowly, 0.9 or less).

TABLE 4

| Sample | Average length of drawn-out strands (mm) | Zero-shear viscosity (Pa · s) | Evaluation parameter $(mm^{-1} \cdot Pa^{-1})$ |
|---|---|---|---|
| (1) | 2.33 | 0.10 | 1.56 |
| (2) | 2.65 | 0.29 | 0.64 |
| (3) | 2.57 | 0.21 | 0.84 |
| (4) | 92.71 | 54.9 | 0.12 |
| (5) | 126.65 | 340.5 | 0.03 |
| (6) | 115.49 | 96.9 | 0.08 |
| (7) | 29.69 | 2.5 | 0.83 |
| (8) | 36.47 | 3.4 | 0.73 |
| (9) | 30.26 | 7.2 | 0.29 |
| (10) | 65.96 | 15.6 | 0.29 |

(Other Preferable Molecular Weight Ranges of Aliphatic Polycarbonate)

In addition, the molecular weight range of aliphatic polycarbonates of this embodiment is not limited to the numerical range disclosed in each of the experimental examples. According to the analysis by the inventors of this application, it is a further preferred mode that, for example, an aliphatic polycarbonate having a molecular weight of 6,000 or more and 300,000 or less constitutes 75% by mass or more of all the aliphatic polycarbonates, from the viewpoint of more reliably controlling stringiness and forming a good pattern.

EXPERIMENTAL EXAMPLE 3

(Evaluation of Contact Angle and Expansion Ratio)

As already mentioned, the aliphatic polycarbonate which is thought to be able to exhibit functions as a binder is an impurity as seen from a metal oxide that is to be finally obtained after a pattern is once formed, and is thus subjected to decomposition or removal. Therefore, the time requiring the binder is namely temporary. However, the inventors have considered that, with regards to whether or not a solution containing aliphatic polycarbonates has the effect of pattern formation (in other words, balanced viscosity or wettability) for maintaining the temporary time, evaluating the contact angle between the solution and a base material when the solution is placed on the base material is used as a suitable index.

Thus, the inventors of this application have investigated how the contact angle between a base material and a solution and the expansion ratio of the solution on the base material would change at 30 seconds and 120 seconds after placement of a polypropylene carbonate solution obtained by dissolving polypropylene carbonate (25 wt %) in a mixed solvent of DEGMEA and 2-nitropropane on the base material (in this experimental example, glass substrate). Here, in order to facilitate the examination of changes in the contact angle, the concentration (wt %) of 2-nitropropane that is a suitable solvent for the aliphatic polycarbonate(s) was varied, and then each of the evaluations was performed. In addition, the "expansion ratio" was calculated based on the actual size of a pattern with respect to the design value.

FIG. 12A is a graph showing the contact angle between the base material and the solution and the expansion ratio of the solution on the base material, with respect to changes in the concentration of 2-nitropropane, at 30 seconds after placing the solution containing aliphatic polycarbonates on the base material. In addition, FIG. 12B is a graph showing the contact angle between the base material and the solution and the expansion ratio of the solution on the base material, with respect to changes in the concentration of 2-nitropropane, at 120 seconds after placing the solution containing aliphatic polycarbonates on the base material.

As shown in FIG. 12A and FIG. 12B, the contact angle between the base material and the solution, and expansion ratio of the solution on the base material are found to be inversely correlated to each other. That is, it has been revealed that as the concentration of 2-nitropropane increases, the contact angle increases while the expansion ratio decreases. However, as shown in FIG. 12B, it has been found that even when the concentration of 2-nitropropane is high (for example, 75%), there is a case where the contact angle does not increase. Moreover, it has been revealed that particularly the contact angle tends to rapidly increase when the concentration of 2-nitropropane reaches a certain level (typically, 55% or more and 60% or less), in both FIGS. 12A and 12B.

According to further researches and analysis by the inventors of this application, it has been found that, when the contact angle exceeds 36° at the stage after 30 seconds or when the contact angle exceeds 32° at the stage after 120 seconds, it results in a situation where the solution containing aliphatic polycarbonates is repelled from the base material, so that it is difficult to form a pattern sufficient for maintaining the temporary time. Accordingly, it is preferred that the solution containing aliphatic polycarbonates be prepared so as to achieve each contact angle described above or less.

On the other hand, it has been found that, when the contact angle is less than 30° at the stage after 30 seconds or when the contact angle is less than 26° at the stage after 120 seconds, the reproducibility of pattern deteriorates, so that it is difficult to form a pattern sufficient for maintaining the temporary time also in this case. Accordingly, it is preferred that the solution containing aliphatic polycarbonates be prepared so as to achieve each contact angle described above or more.

<Second Embodiment>

1. Entire Structure of Thin Film Transistor of This Embodiment

FIGS. 13 to 18 are each a schematic sectional view showing a process in a method of producing a thin film transistor 500 that is an example of a semiconductor element. FIG. 19 is a schematic sectional view showing a process in the method of producing a thin film transistor 500 in this embodiment and an entire structure of the thin film transistor. As shown in FIG. 19, the thin film transistor 500 in this embodiment includes a substrate 10, on which a gate electrode 24, a gate insulator 34, a source electrode 58 and a drain electrode 56, a channel 44, and a channel stopper layer 84 are stacked from the lower side in the mentioned order.

Also, a person skilled in the art comprehending the semiconductor element according to this embodiment can fully comprehend provision or achievement of an electronic device including this semiconductor element (for example, a mobile terminal, an information appliance, or other known electric appliances), with no particular description. In addition, the step for forming various oxide precursor layers, which is described later, corresponds to a step for forming the "first oxide precursor layer" or "second oxide precursor layer" in this application.

As a representative example, a method of producing an oxide semiconductor precursor and an oxide semiconductor layer is described in detail in Patent Document 4 (International Publication No. WO 2015/019771) disclosed by the present applicants. Therefore, a description overlapping the description of the pattern 80 of the first oxide precursor layer, the oxide layer 44, or the second oxide precursor layer 42 in the first embodiment can be omitted.

In addition, although the thin film transistor 500 of this embodiment employs a so-called bottom gate structure, this embodiment is not limited to this structure. Therefore, a person skilled in the art can form the top gate structure by changing the order of the steps by referring to the description of this embodiment with common technical knowledge. In that case, the channel stopper layer 84 of this embodiment can be also utilized as a gate insulator. In addition, the display of the temperature in this application represents the surface temperature of the heating surface of a heater, which comes into contact with a substrate. Further, in order to simplify the drawing, the description of the patterning of an extraction electrode from each electrode is omitted.

The substrate 10 of this embodiment is not particularly limited, and a substrate generally used for a semiconductor element is used. For example, the substrate 10 can adopt any one of various base materials including an insulating substrate such as highly heat resistant glass, a $SiO_2$/Si substrate (i.e., a substrate in which a silicon oxide film is formed on a silicon substrate), an alumina ($Al_2O_3$) substrate, an STO (SrTiO) substrate, or an insulating substrate obtained by forming an STO (SrTiO) layer on a surface of a Si substrate with an $SiO_2$ layer and a Ti layer being interposed therebetween, and a semiconductor substrate (for example, a Si substrate, a SiC substrate, a Ge substrate, or the like). Examples of the insulating base material include films or sheets made of materials such as polyesters including polyethylene terephthalate and polyethylene naphthalate, polyolefins, cellulose triacetate, polycarbonate, polyamide, polyimide, polyamide imide, polysulfone, aramid, and aromatic polyamide. Although the thickness of the substrate is not particularly limited, it is, for example, 3 μm or more and 300 μm or less. Also, the substrate may be hard or flexible.

2. Method of Producing Thin Film Transistor of This Embodiment (1) Formation of Gate Electrode In this embodiment, as a material of the gate electrode 24, a compound of metal to be oxidized into an oxide conductive material (hereinafter also simply referred to as "oxide conductive material") can be adopted. In this case, the gate electrode 24 of this embodiment is formed by annealing a precursor layer of an oxide conductive material (hereinafter, also referred to as an "oxide conductive material precursor layer") in which an oxide conductive material (possibly including inevitable impurities. The same applies to not only oxides of this material but also oxides of other materials to the followings) is dispersed in a solution containing aliphatic polycarbonates. In this embodiment, a gate electrode precursor layer can be formed by applying a gate electrode precursor solution that is a starting material on a $SiO_2$/Si substrate that is a base material (hereinafter, also simply referred to as "substrate") 10 using a low-energy production process (for example, a printing method or a spin coating method).

Thereafter, an annealing step of heating the gate electrode precursor layer is performed, for example, at 450° C. to 550° C. for a predetermined time (for example, 10 minutes to 1 hour) in the air. As a result, the gate electrode 24 is formed on the substrate 10. In addition, the thickness of the layer of the gate electrode 24 of this embodiment is, for example, about 100 nm.

Here, an example of the oxide conductive material is a material having a structure (typically, a complex structure) in which a ligand is coordinated to a metal to be oxidized into an oxide conductive material. For example, metal organic acid salts, metal inorganic acid salts, metal halides, or various metal alkoxides can be included in the oxide conductive material of this embodiment. Moreover, an example of a metal to be oxidized into an oxide conductive material is ruthenium (Ru). In this embodiment, a gate electrode precursor solution using a solution as a starting material, which has been prepared by dissolving ruthenium (III) nitrosylacetate in a mixed solvent of propionic acid and 2-aminoethanol containing aliphatic polycarbonates is subjected to an annealing step of heating, for example, at about 450° C. to about 550° C. for a predetermined time (for example, 10 minutes to 1 hour) in the air, so that a ruthenium oxide that is an oxide conductive material is formed, and thus the gate electrode 24 can be formed.

Here, with the use of a gate electrode precursor solution employing the aliphatic polycarbonates described in Modification Example (3) of the first embodiment, a good pattern can be formed, for example, when a pattern of the gate electrode precursor layer is formed using a printing method. More specifically, this makes it possible to appropriately control the stringiness of the aliphatic polycarbonates in the gate electrode precursor solution, so that a good pattern of the gate electrode precursor layer can be formed.

In this embodiment, instead of the gate electrode 24, for example, a high melting point metal such as platinum, gold, silver, copper, aluminum, molybdenum, palladium, ruthenium, iridium or tungsten, a metal material such as alloy thereof, or a $p^+$-silicon layer or an $n^+$-silicon layer can be applied. In that case, the gate electrode 24 can be formed on the substrate 10 by a known sputtering method or CVD method.

(2) Formation of Gate Insulator

Further, in this embodiment, a gate insulator 34 is formed by annealing a precursor layer of an oxide insulator (hereinafter, also referred to as an "oxide insulator precursor layer") in which a compound of metal to be oxidized into an oxide insulator (hereinafter, also simply referred to as an "oxide insulator") is dispersed in a solution containing aliphatic polycarbonates.

Specifically, as shown in FIG. 13, a gate insulator precursor layer 32 is formed by applying the oxide insulator precursor on the gate electrode 24 using a low-energy production process (for example, a printing method or a spin coating method).

Thereafter, the gate insulator precursor layer 32 in a gel state is subjected to an annealing (main annealing) step of heating, for example, at about 450° C. to about 550° C. for a predetermined time (for example, 10 minutes to 1 hour) in the air, so that, for example, an oxide composed of lanthanum (La) and zirconium (Zr) that is an oxide insulator is formed. As a result, as shown in FIG. 14, the gate insulator 34 can be formed. In addition, the thickness of the layer of the gate insulator 34 of this embodiment is, for example, about 100 nm to about 250 nm.

Here, an example of the oxide insulator is a material having a structure (typically, a complex structure) in which a ligand is coordinated to a metal to be oxidized into an oxide insulator. For example, metal organic acid salts, metal inorganic acid salts, metal halides, various metal alkoxides, or other organic acid salts, inorganic acid salts, halides, or various alkoxides can also be included in the oxide insulator of this embodiment.

An example of a typical oxide insulator is an oxide composed of lanthanum (La) and zirconium (Zr). This oxide can be adopted as the gate insulator 34. In this embodiment, a first solution is prepared by dissolving lanthanum (III) acetate in propionic acid (solvent) containing aliphatic polycarbonates, and a second solution is prepared by dissolving zirconium butoxide in propionic acid (solvent) containing aliphatic polycarbonates. An annealing step of heating a gate insulator precursor solution as a starting material prepared by mixing the first solution and the second solution is performed, for example, at about 450° C. to about 550° C. for a predetermined time (for example, 10 minutes to 1 hour) in the air, so that an oxide insulator can be formed.

Here, with the use of an oxide insulator precursor employing the aliphatic polycarbonates described in Modification Example (3) of the first embodiment, a good pattern can be formed, for example, when a pattern of the gate insulator precursor layer 32 is formed using a printing method. More specifically, this makes it possible to appropriately control the stringiness of the aliphatic polycarbonates in an oxide insulator precursor, so that a good pattern of the gate insulator precursor layer 32 can be formed.

Further, in this embodiment, for example, silicon oxide or silicon oxynitride can be applied, instead of the gate insulator 34. In that case, the gate insulator 34 can be formed on the gate electrode 24 by a known CVD method or the like.

(3) Formation of Source Electrode and Drain Electrode

Thereafter, as shown in FIG. 15, an ITO layer is formed on the gate insulator 34 by a known sputtering method. The target material of this embodiment is, for example, ITO containing 5 wt % tin oxide ($SnO_2$), and is formed under a condition of room temperature to 100° C. Thereafter, by using a known photolithography method, the drain electrode 56 and the source electrode 58 of the ITO layer are formed.

In this embodiment, instead of the drain electrode 56 and the source electrode 58 described above, a method of forming a drain electrode pattern and a source electrode pattern using paste silver (Ag) or paste ITO (indium tin oxide), for example, by a printing method, is an adoptable mode. Also, instead of the drain electrode 56 and the source electrode 58, a gold (Au) or aluminum (Al) drain electrode pattern and a gold (Au) or aluminum (Al) source electrode pattern formed by a known vapor deposition method may be adopted.

(4) Formation of Channel and Channel Stopper Layer

Further, in this embodiment, a channel 44 is formed by annealing a precursor layer of an oxide semiconductor (hereinafter, also referred to as an "oxide semiconductor precursor layer"), wherein a compound of metal to be oxidized into an oxide semiconductor (hereinafter, also simply referred to as an "oxide semiconductor") is dispersed in a solution containing aliphatic polycarbonates. In this embodiment, as shown in FIG. 16, a channel precursor layer 42 can be formed by applying a channel precursor solution that is a starting material, on the gate insulator 34, the drain electrode 56, and the source electrode 58, using a low-energy production process (for example, a printing method or a spin coating method).

Thereafter, the channel precursor layer 42 is subjected to an annealing step described later, so that the channel 44 is formed as shown in FIG. 19.

Here, an example of the oxide semiconductor is a material having a structure (typically, a complex structure) in which a ligand is coordinated to a metal to be oxidized into an oxide semiconductor. For example, metal organic acid salts, metal inorganic acid salts, metal halides, or various metal alkoxides can also be included in the materials for constituting the oxide semiconductor of this embodiment. An example of a typical oxide semiconductor is InZnO. For example, a channel precursor solution ("InZn solution" of the first embodiment) obtained by dissolving indium acetylacetonate and zinc chloride in propionic acid containing aliphatic polycarbonates is subjected to an annealing step of heating at 450° C. to 550° C. for a predetermined time (for example, 10 minutes to 1 hour) in the air. As a result, indium-zinc oxide (hereinafter, also referred to as "InZnO") that is an oxide semiconductor can be formed. InZnO can constitute the channel 44 of this embodiment.

Incidentally, examples of the metal to be oxidized into an oxide semiconductor are one or more members selected from the group consisting of indium, tin, zinc, cadmium, titanium, silver, copper, tungsten, nickel, indium-zinc, indium-tin, indium-gallium-zinc, antimony-tin, and gallium-zinc. However, from the viewpoint of element performance, stability, and the like, indium-zinc is preferably adopted as a metal to be oxidized into an oxide semiconductor.

Here, with the use of a channel precursor solution employing the aliphatic polycarbonates described in Modification Example (3) of the first embodiment, a good pattern can be formed, when a pattern of the channel precursor layer 42 is formed using a printing method. More specifically, this makes it possible to appropriately control the stringiness of the aliphatic polycarbonates in the channel precursor solution, so that a good pattern of the channel precursor layer 42 can be formed.

In addition, in this embodiment, particularly when forming the channel 44 that is an oxide semiconductor layer, an invention relating to the method of producing a metal oxide, for example, as disclosed in Patent Document 4 that has been devised by the inventors of this application so far, can be adopted as a preferable example.

Further, the phase state of the oxide semiconductor is not particularly limited. For example, the phase state may be any one of the crystal form, the polycrystal form, and the amorphous form. In addition, dendritic or scaly crystals as a result of crystal growth are also one phase state that can be adopted in this embodiment. Furthermore, it is obvious that it is also not specified by a patterned shape (for example, a spherical shape, an elliptical shape, or a rectangular shape).

Next, a specific method of forming patterns of the channel 44 and the channel stopper layer 84 will be described.

As described above, in this embodiment, as shown in FIG. 16, a channel precursor layer 42 is formed by applying a channel precursor solution on the gate insulator 34, the drain electrode 56, and the source electrode 58, using a low-energy production process (for example, a printing method).

The thickness (wet) of the channel precursor layer 42 that is an oxide semiconductor precursor layer is not particularly limited.

Thereafter, as a preliminary annealing step (also referred to as a "first preliminary annealing step"), heating is performed, for example, at 150° C. for a predetermined time (for example, 3 minutes) to form a channel precursor layer 42 having a thickness of about 60 nm. This first preliminary annealing step is primarily intended to promote gelation of the second oxide precursor layer 42 and fix it.

In this embodiment, thereafter, as shown in FIG. 17, the pattern 80 of the first oxide precursor layer in the first embodiment is formed on the channel precursor layer 42 (pattern forming step) using, for example, a printing method (as one example, a screen printing method).

Subsequently, by using the pattern 80, a pattern of the channel precursor layer 42 is formed by an etching step. Specifically, the pattern 80 and the channel precursor layer 42 are brought into contact (typically, immersed in the etching solution) with a commercially available etching solution (model "ITO-02", manufactured by KANTO CHEMICAL CO., INC.) that is a solution capable of dissolving the channel precursor layer 42 (contact step). As a result, as shown in FIG. 18, the channel precursor layer 42 that is not protected by a pattern of the pattern 80 is etched and thus removed. On the other hand, the channel precursor layer 42 protected by the pattern of the pattern 80 remains on the gate insulator 34, the drain electrode 56, and the source electrode 58, without being etched.

Then, in order to decompose the aliphatic polycarbonates in the pattern 80 (in particular, aliphatic polycarbonates) and the channel precursor layer 42 on which the pattern is formed, a second preliminary annealing step (drying step) is performed at a predetermined temperature (first temperature). Thereafter, as main annealing, the pattern 80 and the channel precursor layer 42 are heated, for example, at 180° C. or more, more preferably 250° C. or more, and further preferably 300° C. or more, in addition, in terms of electrical characteristics, extremely preferably in the range of 500° C. or more, for a predetermined time, in an oxygen-containing atmosphere. In the first embodiment, since description of "first temperature" and "second temperature" has been made, the description is omitted here.

When main annealing, that is, an "annealing step", is performed, as shown in FIG. 19, the aliphatic polycarbonates constituting a part of the etching mask of the pattern 80 and the aliphatic polycarbonates in the channel precursor layer 42 to be etched are decomposed and/or removed. As a result, the channel precursor layer 42 becomes the channel 44, and the pattern 80 becomes the channel stopper layer 84 that is an oxide insulator. As a result, a laminate having a pattern in which the channel stopper layer 84 is placed on the channel 44 is produced, so that the thin film transistor 500 of this embodiment can be produced.

Incidentally, in this embodiment, the channel precursor layer 42 is etched using the pattern 80, but this embodiment is not limited to such a mode. For example, as in the first embodiment, it is also an adoptable mode that the channel 44 is formed by an annealing step before the pattern 80 of the first oxide precursor layer is formed, and then the channel 44 is etched by the pattern 80.

Moreover, in any of the first preliminary annealing step, the second preliminary annealing step, and the main annealing (annealing step) described above, the heating method is not particularly limited. For example, a conventional heating method using a thermostat, an electric furnace or the like may be used. In particular, when the substrate is weak to heat, it is preferable to use a method of heating only the oxide semiconductor layer by ultraviolet (ultraviolet light) heating, electromagnetic wave heating, or lamp heating so that heat is not transferred to the substrate.

In addition, in the process of removing the pattern 80 and the process of forming the channel 44, aliphatic polycarbonates can not only reduce or eliminate decomposition products remaining in the oxide semiconductor layer after annealing decomposition, but also contribute to accurate formation of the oxide semiconductor layer. Therefore, adoption of aliphatic polycarbonates is a preferred mode of this embodiment.

In this embodiment, for example, it has been confirmed by the research of the inventors of this application that, when a printing method (for example, a screen printing method) is used, the final thickness of the channel 44 can be controlled by varying the weight ratio of the compound of metal to be oxidized into an oxide semiconductor to the aliphatic polycarbonates, or by changing the concentration of the aliphatic polycarbonates or the compound of metal. For example, it has been found that a channel 44 having a thickness of 10 nm to 50 nm, which is regarded as a very thin layer, can be formed without causing cracks. Not only the thin layer but also a layer having a thickness of 50 nm or more can be relatively easily formed by appropriately adjusting the thickness of the channel precursor layer 42, the weight ratio, or the like. In general, since the thickness of the layer used for the channel is 0.01 μm (i.e., 10 nm) or more and 1 μm or less, the oxide semiconductor precursor and the oxide semiconductor layer of this embodiment that can control the final thickness of the channel 44 are regarded as suitable as a material for constituting a thin film transistor.

In addition, by adopting the oxide semiconductor precursor of this embodiment, even when an oxide semiconductor precursor layer having a considerably large thickness (for example, 10 μm or more) is initially formed, the aliphatic polycarbonates and the like are decomposed highly reliably in the subsequent annealing step, and thus the thickness of the layer after annealing can be extremely thin (for example, 10 nm to 100 nm). Furthermore, it is worth noting that cracks do not occur or are highly reliably suppressed even in such a thin layer. Therefore, it has been found that the oxide semiconductor precursor of this embodiment, which can sufficiently secure the initial thickness and can eventually form an extremely thin layer, and the oxide semiconductor layer are very suitable for a low-energy production process and a process by a known imprinting process. In addition, adoption of an oxide semiconductor layer in which cracks do not occur or are highly reliably suppressed even in such an extremely thin layer extremely enhances the stability of the thin film transistor 500 of this embodiment.

Furthermore, in this embodiment, by properly adjusting the type and combination of the oxide semiconductor and the mixing ratio of the oxide semiconductor and the aliphatic polycarbonates, it is possible to improve the electrical characteristics and stability of the oxide semiconductor layer forming the channel.

<Modification Example (1) of Second Embodiment>

In the second embodiment, the pattern of the channel 44 is formed by the contact step of bringing into contact with the solution for dissolving the channel precursor layer 42 or the predetermined etching solution that is a solution for dissolving the oxide layer, and the second embodiment is not limited to a treatment using an etching solution.

For example, it is also an adoptable mode to etch the channel precursor layer 42 in the region not protected by the pattern 80, using an exposure step of exposing to plasma of a known gas for etching the channel precursor layer 42 that is the oxide semiconductor precursor layer of the second embodiment. As a result, the channel precursor layer 42 in the region not exposed to the plasma is subjected to a heating step thereafter to be the channel 44. In addition, it is made possible to decompose and/or remove the aliphatic polycarbonates constituting a part of the etching mask of the pattern 80 by the heating step.

As a result, it is possible to produce a laminate having a pattern, in which the channel stopper layer 84 is placed on the channel 44, namely by one treatment (heating step).

Also in this modification example, the step of forming the pattern of the channel 44 by the exposure step of exposing to the plasma after forming the channel 44 that is the oxide semiconductor layer is also another adoptable mode.

<Modification Example (2) of Second Embodiment>

Also, in the second embodiment, the pattern 80 of the first oxide precursor layer is utilized for forming the pattern of the channel 44, and utilization of the pattern 80 for forming a pattern of another layer (for example, an oxide conductive material layer or an oxide insulator layer) is also another adoptable mode. Even when the pattern 80 is adopted for the other layer, the layer of the oxide conductive material on which the pattern is formed can have conductivity, and the oxide insulator layer on which the pattern is formed can have insulating properties.

<Other Embodiment (1)>

Incidentally, in each of the embodiments, the second oxide precursor layer or the oxide layer is an object of the etching treatment, but each of the embodiments is not limited to these examples. For example, it is possible to produce a laminate having a pattern in which a pattern of a metal is formed by etching a part of the metal and in which, for example, the first oxide layer 84 of the first embodiment is placed on the pattern of the metal.

<Other Embodiment (2)>

Further, for example, the pattern 80 of the first oxide precursor layer of each of the embodiments can be used for forming a pattern of an insulator by etching a part of the insulator. An example of the insulator is a silicon dioxide layer ($SiO_2$).

<Other Embodiment (3)>

In addition, in the second embodiment and its modification examples described above, a thin film transistor having a so-called inverted staggered structure is described. However, each of the embodiments is not limited to its structure. For example, effects similar to those of each of the embodiments can be exerted not only by a thin film transistor having a staggered structure but also by a thin film transistor having a so-called planar structure in which a source electrode, a drain electrode, and a channel are placed on the same plane. Further, formation of the oxide semiconductor layer of each of the embodiments on the base material or the substrate is also another adoptable mode.

<Other Embodiment (4)>

In addition, examples in which the laminate of each of the embodiments is utilized are not limited to semiconductor elements represented by thin film transistors. For example, an oxide to be a transparent conductor (for example, an indium oxide or an indium-zinc oxide which can be used as an oxide conductive material or an oxide semiconductor) after etching the layer to be etched by the pattern 80 of the first oxide precursor layer is allowed to remain as an upper layer of the laminate, whereby the upper layer can be utilized as a transparent electrode of a light emitting diode (LED) or a laser diode (LD). Further, an oxide to be the conductor using the pattern 80 as a starting material is allowed to remain as an upper layer of the laminate, after etching a dielectric layer (for example, $ZrO_2$) to be etched using the pattern 80 of the first oxide precursor layer, whereby the upper layer can be utilized as an upper electrode of a capacitor.

As described above, the disclosures of each of the embodiments and the experimental examples described above have been described for explaining these embodiments and experimental examples and have not been described for limiting the present invention. In addition, modification examples that are within the scope of the present invention including other combinations of each of the embodiments are also be included in the scope of the claims.

INDUSTRIAL APPLICABILITY

The present invention can be broadly applied to the fields of electronic devices including a mobile terminal, an information appliance, a sensor, any other known electric appliance, MEMS (Micro Electro Mechanical Systems) or NEMS (Nano Electro Mechanical Systems), medical devices, and the like including various semiconductor elements, capacitors, laser diodes or light emitting diodes, and the like.

The invention claimed is:

1. A laminate, wherein
a pattern of a first oxide precursor layer in which a compound of metal to be oxidized into a metal oxide is dispersed in a solution containing a binder including aliphatic polycarbonates is placed as an etching mask on an oxide layer to be etched or on a second oxide precursor layer to be etched and to be oxidized into the oxide layer.

2. The laminate according to claim 1, wherein,
in the aliphatic polycarbonates, an aliphatic polycarbonate having a molecular weight of 6,000 or more and 400,000 or less constitutes 80% by mass or more of all the aliphatic polycarbonates.

3. The laminate according to claim 1, wherein
the aliphatic polycarbonates have a value of $L/(D \times v \times \eta)$ of $0.25 \text{ mm}^{-1}\text{Pa}^{-1}$ or more when a cylindrical bar made of polytetrafluoroethylene and having a diameter "D" is dipped in a collection of the aliphatic polycarbonates having a zero-shear viscosity "$\eta$" as measured using a rheometer (TA Instruments, AR-2000EX), the cylindrical bar is raised at a velocity "v" and then the length "L" of a strand drawn out from the outermost surface of the collection of the aliphatic polycarbonates is measured.

4. The laminate according to claim 1, wherein
the metal oxide layer is a channel stopper layer or a gate insulator, and the oxide layer is a channel.

5. An etching mask for an oxide layer or a second oxide precursor layer to be oxidized into the oxide layer, comprising
a pattern of a first oxide precursor layer in which a compound of metal to be oxidized into a metal oxide is dispersed in a solution containing a binder including aliphatic polycarbonates.

6. The etching mask according to claim 5, wherein
the aliphatic polycarbonates are made of aliphatic polycarbonates which are substantially eliminated or removed by heating at 180° C. or more.

7. The etching mask according to claim 5, wherein
the contact angle of the pattern to a base material is 30° or more and 36° or less at 30 seconds after the pattern is placed on the base material, or the contact angle of the pattern to the base material is 26° or more and 32° or less at 120 seconds after the pattern is placed on the base material.

8. A method of producing a laminate, comprising:
a pattern forming step of forming a pattern of a first oxide precursor layer in which a compound of metal to be oxidized into a metal oxide is dispersed in a solution containing a binder including aliphatic polycarbonates on an oxide layer or on a second oxide precursor layer to be oxidized into the oxide layer;
an etching step of, after the pattern forming step, etching the oxide layer or the second oxide precursor layer that is not protected by the pattern; and
a heating step of, after the etching step, heating the oxide layer or the second oxide precursor layer, and the first oxide precursor layer to at least a temperature at which the binder is decomposed.

9. The method of producing a laminate according to claim 8, wherein,
in the aliphatic polycarbonates, an aliphatic polycarbonate having a molecular weight of 6,000 or more and 400,000 or less constitutes 80% by mass or more of all the aliphatic polycarbonates.

10. The method of producing a laminate according to claim 8, wherein
the aliphatic polycarbonates have a value of $L/(D \times v \times \eta)$ of $0.25 \text{ mm}^{-1}\text{Pa}^{-1}$ or more when a cylindrical bar made of polytetrafluoroethylene and having a diameter "D" is dipped in a collection of the aliphatic polycarbonates having a zero-shear viscosity "$\eta$" as measured using a rheometer (TA Instruments, AR-2000EX), the cylindrical bar is raised at a velocity "v" and then the length "L" of a strand drawn out from the outermost surface of the collection of the aliphatic polycarbonates is measured.

11. The method of producing a laminate according to claim 8, wherein the pattern is formed by a screen printing method.

12. A method of producing a thin film transistor, comprising
a channel layer forming step of placing the oxide layer, as a channel layer, among the laminate formed by the heating step of the method of producing a laminate according to claim 8, so as to be in contact with a source electrode and a drain electrode.

13. A method of producing an etching mask for an oxide layer or a second oxide precursor layer to be oxidized into the oxide layer, the method comprising
a pattern forming step of forming a pattern of a first oxide precursor layer in which a compound of metal to be oxidized into a metal oxide is dispersed in a solution containing a binder (possibly including inevitable impurities) made of aliphatic polycarbonates.

* * * * *